US012681063B2

(12) United States Patent
Sato et al.

(10) Patent No.: US 12,681,063 B2
(45) Date of Patent: Jul. 14, 2026

(54) SENSOR MODULE

(71) Applicant: SEIKO EPSON CORPORATION, Tokyo (JP)

(72) Inventors: Kenta Sato, Shiojiri (JP); Masayoshi Todorokihara, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 184 days.

(21) Appl. No.: 18/474,217

(22) Filed: Sep. 25, 2023

(65) Prior Publication Data

US 2024/0110960 A1 Apr. 4, 2024

(30) Foreign Application Priority Data

Sep. 27, 2022 (JP) ................................. 2022-153603

(51) Int. Cl.
*G01R 23/10* (2006.01)
*G01R 31/317* (2006.01)

(52) U.S. Cl.
CPC ....... *G01R 23/10* (2013.01); *G01R 31/31727* (2013.01)

(58) Field of Classification Search
CPC .............. G01R 23/10; G01R 31/31727; G01R 19/2506; G01R 19/2503; G01P 15/18; G01P 15/09; G01P 15/097; G01P 21/00
See application file for complete search history.

(56) References Cited

U.S. PATENT DOCUMENTS

| | | | |
|---|---|---|---|
| 2010/0057384 A1* | 3/2010 | Inukai | G01C 19/5607 |
| | | | 702/56 |
| 2010/0066423 A1* | 3/2010 | Inukai | G01P 15/125 |
| | | | 327/163 |
| 2017/0324596 A1* | 11/2017 | Kokuyama | H03L 7/085 |
| 2019/0086270 A1* | 3/2019 | Kokuyama | H03L 7/091 |
| 2019/0334528 A1* | 10/2019 | Todorokihara | H03K 21/406 |

FOREIGN PATENT DOCUMENTS

JP     2011-259624 A     12/2011

* cited by examiner

*Primary Examiner* — Akm Zakaria
(74) *Attorney, Agent, or Firm* — Rankin, Hill & Clark LLP

(57) ABSTRACT

A sensor module includes: a count unit configured to generate first to n-th count values of a time event of one of a measurement target signal output from a physical quantity sensor and a reference periodic signal output from a reference periodic signal generation unit in synchronization with the other; a time digital value generation unit configured to generate first to n-th time digital values based on a phase difference between the measurement target signal and the reference periodic signal; and a combined output value generation unit configured to generate an i-th combined output value based on the i-th time digital value and the i-th count value. A quantization error of the j-th combined output value is fed back to generation of the (j+1)-th combined output value, and a period of a change in the physical quantity when a frequency, at which the physical quantity changes, is a maximum frequency is longer than eight times an average period in which first to n-th combined output values are generated.

12 Claims, 19 Drawing Sheets

FIG. 3
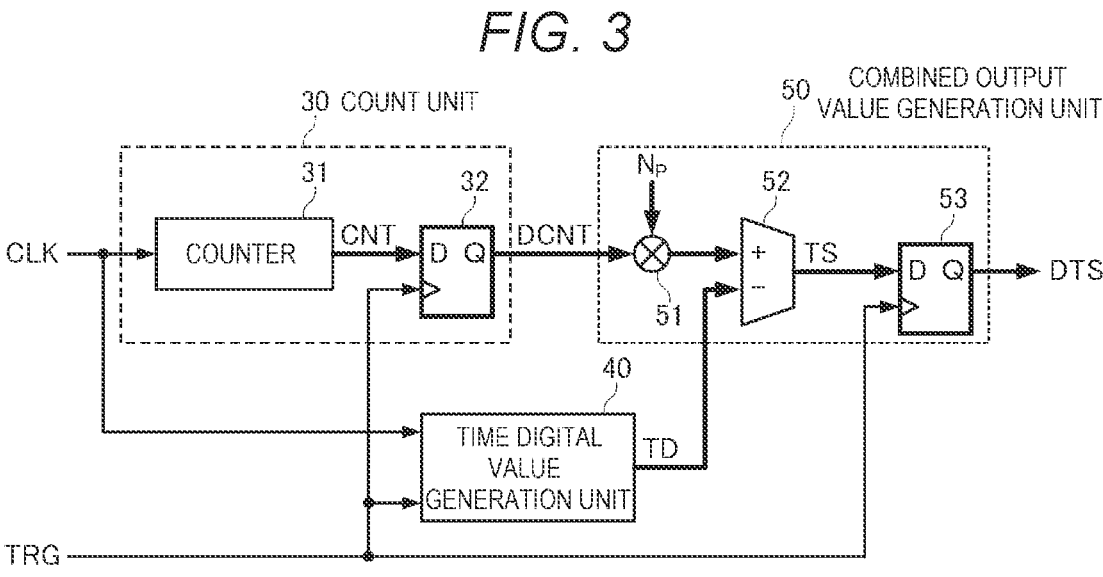
FIG. 4
FIG. 5
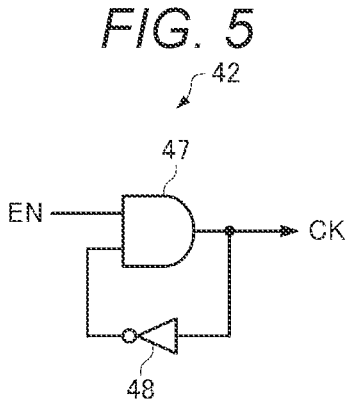

FIG. 11

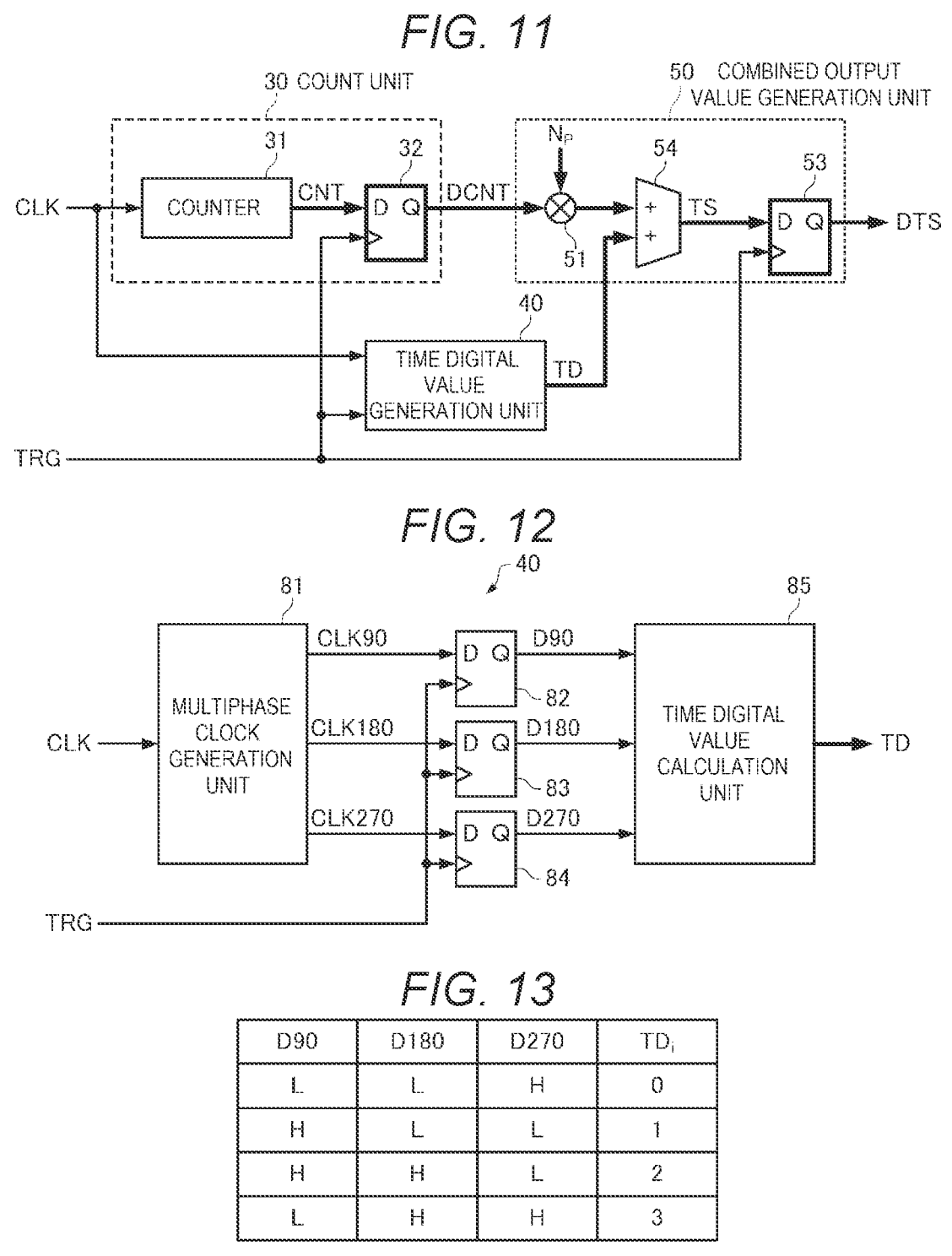

30 COUNT UNIT

50    COMBINED OUTPUT VALUE GENERATION UNIT

CLK → COUNTER (31) → CNT → D Q (32) → DCNT → ⊗ (51) $N_P$ → + + (54) → TS → D Q (53) → DTS

40 TIME DIGITAL VALUE GENERATION UNIT → TD

TRG

81 MULTIPHASE CLOCK GENERATION UNIT

CLK →

TRG →

CLK90 → D Q (82) → D90 →
CLK180 → D Q (83) → D180 →
CLK270 → D Q (84) → D270 →

85 TIME DIGITAL VALUE CALCULATION UNIT → TD

FIG. 13

| D90 | D180 | D270 | $TD_i$ |
|-----|------|------|--------|
| L | L | H | 0 |
| H | L | L | 1 |
| H | H | L | 2 |
| L | H | H | 3 |

| A₁ | A₂ | A₃ | A₄ | A₅ | ... | A_q | A_{p-1} |
|---|---|---|---|---|---|---|---|
| $DTS_1$ $(DTS_{p+1})$ | $DTS_2$ $(DTS_{p+2})$ | $DTS_3$ $(DTS_{p+3})$ | $DTS_4$ $(DTS_{p+4})$ | $DTS_5$ $(DTS_{p+5})$ | ... | $DTS_p$ $(DTS_{2p})$ | $DCNT_q$ |

FIG. 23
| DTSx$_{k+1}$ | DTSx$_{k+2}$ | DTSx$_{k+3}$ | DTSx$_{k+4}$ | DTSx$_{k+5}$ | DTSx$_{k+6}$ | DTSx$_{k+7}$ | DCNTx$_{k+7}$ |
|---|---|---|---|---|---|---|---|
| 28593 | 28699 | 28724 | 28720 | 28802 | 28750 | 28908 | 83 |
| DTSy$_{k+1}$ | DTSy$_{k+2}$ | DTSy$_{k+3}$ | DTSy$_{k+4}$ | DTSy$_{k+5}$ | DTSy$_{k+6}$ | DTSy$_{k+7}$ | DCNTy$_{k+7}$ |
|---|---|---|---|---|---|---|---|
| 24173 | 24392 | 24190 | 24464 | 24278 | 24476 | 24325 | 125 |
| DTSz$_{k+1}$ | DTSz$_{k+2}$ | DTSz$_{k+3}$ | DTSz$_{k+4}$ | DTSz$_{k+5}$ | DTSz$_{k+6}$ | DTSz$_{k+7}$ | DCNTz$_{k+7}$ |
|---|---|---|---|---|---|---|---|
| 22545 | 22591 | 22555 | 22624 | 22635 | 22623 | 22661 | 17 |
FIG. 24
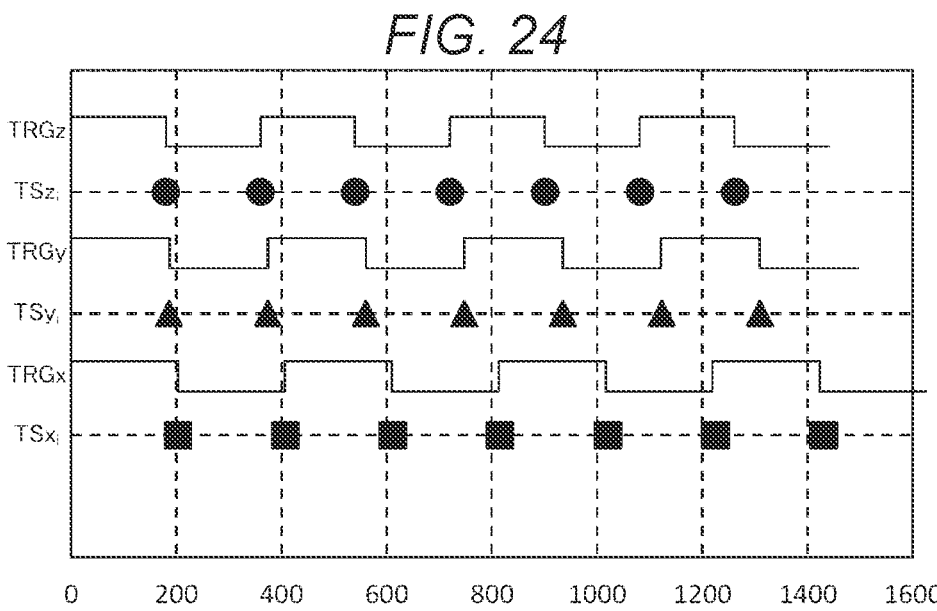
FIG. 25
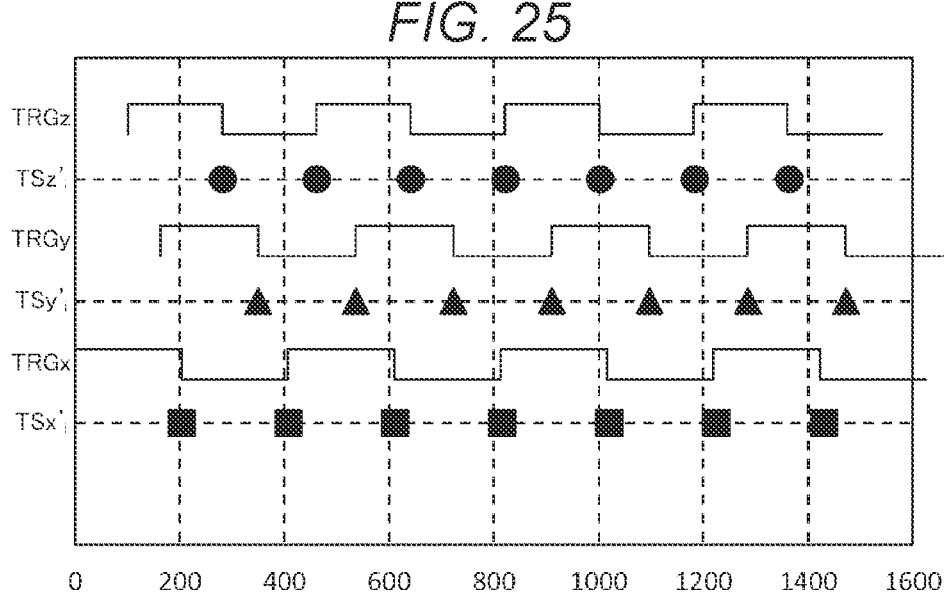

SENSOR MODULE

The present application is based on, and claims priority from JP Application Serial Number 2022-153603, filed Sep. 27, 2022, the disclosure of which is hereby incorporated by reference herein in its entirety.

BACKGROUND

1. Technical Field

The present disclosure relates to a sensor module.

2. Related Art

A sensor module is known that generates, based on a measurement target signal output from a physical quantity sensor attached to a measurement target object, data corresponding to a magnitude of a physical quantity added to the measurement target object and output the data. In such a sensor module, a frequency components based on various types of high-frequency electromagnetic vibration noise generated due to a structure and an operation of the measurement target object or a higher harmonic components of the frequency components may be contained in the measurement target signal, and it is required to reduce an influence of such a high-frequency electromagnetic vibration components and generate highly accurate data.

JP-A-2011-259624 describes a method of removing a high-frequency electromagnetic vibration components, in which a higher harmonic electromagnetic vibration components generated by an inverter power supply is removed from a frequency spectrum generated by Fourier-transforming first vibration acceleration data obtained from a vibration sensor provided in a rolling bearing unit of a rotary machine driven by the inverter power supply. The method of removing the high-frequency electromagnetic vibration components includes: detecting a plurality of peak values from the frequency spectrum; obtaining all frequency intervals between a reference peak value and the plurality of detected peak values; determining a reference frequency interval from the frequency intervals; extracting a peak value, at which the frequency interval is an integral multiple of the reference frequency interval, as a target peak value; reducing a level of the target peak value of the frequency spectrum to a predetermined level; and removing the high-frequency electromagnetic vibration components from the inverter power supply.

According to the sensor module described in JP-A-2011-259624, it is necessary to remove a high-frequency electromagnetic vibration components contained in a measurement target signal, and a circuit scale is large.

SUMMARY

An aspect of the present disclosure is a sensor module including: a physical quantity sensor configured to output a measurement target signal whose frequency changes according to a magnitude of a detected physical quantity; a reference periodic signal generation unit configured to output a reference periodic signal; a count unit configured to count a time event of one of the measurement target signal and the reference periodic signal in synchronization with the other to generate first to n-th count values in time series, n being an integer of 2 or more; a time digital value generation unit configured to generate first to n-th time digital values, based on a phase difference between the measurement target signal and the reference periodic signal, in time series; and a combined output value generation unit configured to generate an i-th combined output value based on the i-th time digital value and the i-th count value, i being an integer of 1 or more and n or less, in which a quantization error of the j-th combined output value is fed back to generation of the (j+1)-th combined output value, j being an integer of 1 or more and n−1 or less, and a period of a change in the physical quantity when a frequency, at which the physical quantity changes, is a maximum frequency in a frequency band which is defined by a specification and in which the physical quantity is detectable, is longer than eight times an average period in which the first to n-th combined output values are generated.

Another aspect of the present disclosure is a sensor module including: first to N-th physical quantity sensors; first to N-th count units; first to N-th time digital value generation units; first to N-th combined output value generation units; first to N-th storage units; and a reference periodic signal generation unit configured to output a reference periodic signal, N being an integer of 2 or more, in which the m-th physical quantity sensor is configured to output an m-th measurement target signal whose frequency changes according to a magnitude of a detected m-th physical quantity, the m-th count unit is configured to count a time event of one of the m-th measurement target signal and the reference periodic signal in synchronization with the other to generate first to n-th count values in time series, n being an integer of 2 or more, the m-th time digital value generation unit is configured to generate first to n-th time digital values, each of which is based on a phase difference between the m-th measurement target signal and the reference periodic signal, in time series, the m-th combined output value generation unit is configured to generate an i-th combined output value based on the i-th time digital value generated by the m-th time digital value generation unit and the i-th count value generated by the m-th count unit, i being an integer of 1 or more and n or less, the m-th storage unit is configured to store p continuous combined output values among the first to n-th combined output values generated by the m-th combined output value generation unit, and the stored p combined output values are output based on a control signal, a quantization error of the j-th combined output value generated by the m-th combined output value generation unit is fed back to generation of the (j+1)-th combined output value, j being an integer of 1 or more and n−1 or less, and a period of a change of the m-th physical quantity when a frequency, at which the m-th physical quantity changes, is a maximum frequency in a frequency band which is defined by a specification and in which the m-th physical quantity is detectable, is longer than eight times an average period in which the first to n-th combined output values are generated by the m-th combined output value generation unit, m being an integer of 1 or more and N or less.

BRIEF DESCRIPTION OF THE DRAWINGS

FIG. 3 is a diagram showing a configuration example of a count unit and a combined output value generation unit according to the first embodiment.

FIG. 4 is a diagram showing a configuration example of a time digital value generation unit according to the first embodiment.

FIG. 5 is a diagram showing a configuration example of an oscillation unit.

FIG. 11 is a diagram showing a configuration example of a count unit and a combined output value generation unit according to a second embodiment.

FIG. 12 is a diagram showing a configuration example of a time digital value generation unit according to the second embodiment.

FIG. 13 is a diagram showing an example of a truth table of a time digital value calculation unit.

FIG. 15 is a diagram showing a configuration example of a time digital value generation unit according to a third embodiment.

FIG. 16 is a diagram showing an example of a relationship between a voltage and an elapsed time from when a switch is turned on.

FIG. 23 is a diagram showing an example of a combined output value and a count value stored in each of first to third storage units.

FIG. 24 is a diagram plotting time stamp values calculated based on data of FIG. 23.

FIG. 25 is a diagram plotting time stamp correction values calculated based on the data of FIG. 23.

DESCRIPTION OF EMBODIMENTS

Hereinafter, a preferred embodiment of the present disclosure will be described in detail with reference to the drawings. The embodiments to be described below do not unduly limit contents of the present disclosure described in the claims. Not all configurations to be described below are necessarily essential components of the present disclosure.

1. First Embodiment

Figure 1:
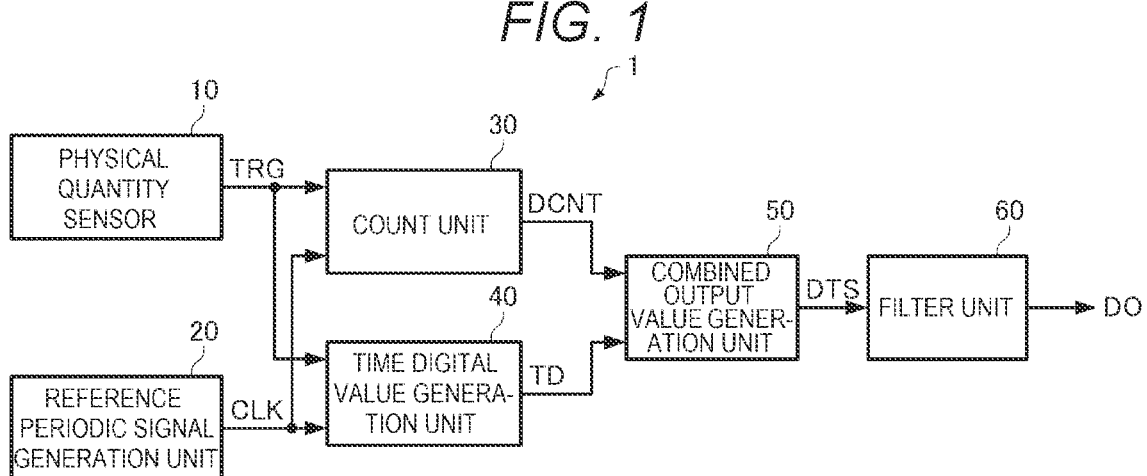
FIG. 1 is a block diagram showing a configuration of a sensor module according to a first embodiment.
Figure 2:
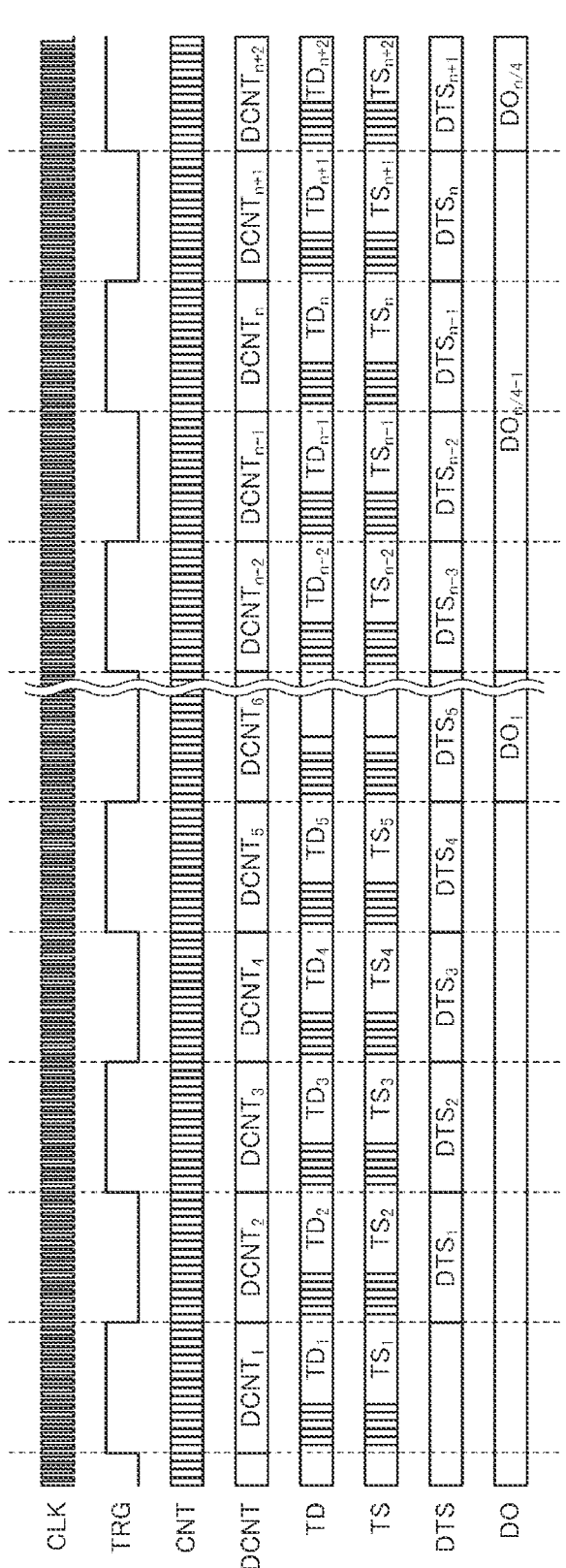
FIG. 2 is a timing chart showing an example of an operation of the sensor module.

FIG. 1 is a block diagram showing a configuration of a sensor module according to a first embodiment. FIG. 2 is a timing chart showing an example of an operation of the sensor module according to the first embodiment. As shown in FIG. 1, a sensor module 1 according to the first embodiment includes a physical quantity sensor 10, a reference periodic signal generation unit 20, a count unit 30, a time digital value generation unit 40, and a combined output value generation unit 50.

The physical quantity sensor 10 is attached to a measurement target object, detects a predetermined physical quantity applied to the measurement target object, and outputs a measurement target signal TRG whose frequency changes according to a magnitude of the detected physical quantity. Specifically, the physical quantity sensor 10 includes a physical quantity detection element (not shown) that detects a physical quantity and an oscillation circuit (not shown) that oscillates the physical quantity detection element. The oscillation circuit outputs the measurement target signal TRG. For example, the physical quantity may be an acceleration, an angular velocity, an angular acceleration, a pressure, a mass, a voltage, a magnetic force, a static capacitance, and a temperature.

The reference periodic signal generation unit 20 outputs a reference periodic signal CLK. For example, the reference periodic signal generation unit 20 may be an oscillation circuit that outputs the reference periodic signal CLK by oscillating a quartz crystal resonator or a silicon MEMS resonator, may be an oscillation circuit using a surface acoustic wave (SAW) resonator, or may be an RC oscillation circuit or an LC oscillation circuit that outputs the reference periodic signal CLK.

The count unit 30 counts a time event of one of the measurement target signal TRG output from the physical quantity sensor 10 and the reference periodic signal CLK output from the reference periodic signal generation unit 20 in synchronization with the other to generate first to n-th count values $DCNT_1$ to $DCNT_n$ in time series, and outputs count data DCNT including the first to n-th count values $DCNT_1$ to $DCNT_n$. n is an integer of 2 or more. The time event of the measurement target signal TRG is a timing at which the measurement target signal TRG changes, and may be, for example, a rising edge or a falling edge of the measurement target signal TRG, or the rising edge and the falling edge of the measurement target signal TRG. Similarly, the time event of the reference periodic signal CLK is a timing at which the reference periodic signal CLK changes, and may be, for example, a rising edge or a falling edge of the reference periodic signal CLK, or the rising edge and the falling edge of the reference periodic signal CLK. In the example of FIG. 2, the count unit 30 counts the rising edge of the reference periodic signal CLK in synchronization with the rising edge and the falling edge of the measurement target signal TRG, and generates the first to n-th count values $DCNT_1$ to $DCNT_n$ in time series.

The time digital value generation unit 40 generates first to n-th time digital values $TD_1$ to $TD_n$, based on a phase difference between the measurement target signal TRG and the reference periodic signal CLK, in time series, and outputs time digital data TD including the first to n-th time digital values $TD_1$ to $TD_n$.

The combined output value generation unit 50 generates an i-th combined output value $DTS_i$ based on the i-th time digital value $TD_i$ included in the time digital data TD and the i-th count value $DCNT_i$ included in the count data DCNT, and outputs combined output data DTS including first to n-th combined output values $DTS_1$ to $DTS_n$. i is an integer of 1 or more and n or less. For example, the combined output value generation unit 50 may generate the first to n-th combined output values $DTS_1$ to $DTS_n$ in synchronization with the measurement target signal TRG.

The combined output value generation unit 50 may generate the first to n-th combined output values $DTS_1$ to $DTS_n$ in time series at rising timings or falling timings of the measurement target signal TRG. Alternatively, as shown in FIG. 2, the combined output value generation unit 50 may generate the first to n-th combined output values $DTS_1$ to $DTS_n$ in time series at both the rising timings and the falling timings of the measurement target signal TRG.

The combined output data DTS including the first to n-th combined output values $DTS_1$ to $DTS_n$ is a signal indicating a frequency ratio between the reference periodic signal CLK and the measurement target signal TRG output from the physical quantity sensor 10.

As shown in FIG. 1, the sensor module 1 according to the first embodiment may include a filter unit 60 in a stage subsequent to the combined output value generation unit 50. The filter unit 60 may perform decimation processing on the first to n-th combined output values $DTS_1$ to $DTS_n$ included in the combined output data DTS, and output measurement data DO. The filter unit 60 may perform moving average processing of even number taps on the first to n-th combined output values $DTS_1$ to $DTS_n$ included in the combined output data DTS, and output the measurement data DO. The filter unit 60 may perform one or both of the moving average processing of the even number taps and the decimation processing on the first to n-th combined output values $DTS_1$ to $DTS_n$. In the example of FIG. 2, the filter unit 60 performs both moving average processing of four taps and decimation processing on the first to n-th combined output values $DTS_1$ to $DTS_n$, and outputs the measurement data DO including first to (n/4)-th measurement values $DO_1$ to $DO_{n/4}$. The measurement data DO output from the filter unit 60 is output from the sensor module 1 to an external device (not shown).

The sensor module 1 configured as described above functions as a frequency counter that outputs the measurement data DO based on the combined output data DTS indicating the frequency ratio between the measurement target signal TRG and the reference periodic signal CLK. While a frequency of the reference periodic signal CLK is constant regardless of the magnitude of the physical quantity detected by the physical quantity sensor 10, a frequency of the measurement target signal TRG changes according to the magnitude of the physical quantity detected by the physical quantity sensor 10. Accordingly, the external device can determine the magnitude of the physical quantity detected by the physical quantity sensor 10 based on the measurement data DO and perform necessary calculation and control.

As is well known, a counting method in the frequency counter includes a direct counting method and a reciprocal counting method. In the direct counting method, of the reference periodic signal CLK and the measurement target signal TRG, the reference periodic signal CLK is used as an operation clock. In the reciprocal counting method, contrary to the direct counting method, the measurement target signal TRG is used as an operation clock. It is considered that measurement can be performed with higher resolution by comparing the frequency of the reference periodic signal CLK with the frequency of the measurement target signal TRG, adopting the direct counting method when the frequency of the reference periodic signal CLK is lower than the frequency of the measurement target signal TRG, and adopting the reciprocal counting method when the frequency of the measurement target signal TRG is lower than the frequency of the reference periodic signal CLK. Accordingly, it is common to adopt a method of using a signal having a lower frequency between the measurement target signal TRG and the reference periodic signal CLK as an operation clock.

Hereinafter, a specific configuration example of the count unit 30, the time digital value generation unit 40, and the combined output value generation unit 50 will be described by taking, as an example, the sensor module 1 that uses the reciprocal counting method of counting the reference periodic signal CLK with the measurement target signal TRG.

FIG. 3 is a diagram showing the configuration example of the count unit 30 and the combined output value generation unit 50. As shown in FIG. 3, the count unit 30 includes a counter 31 and a D-flip-flop 32. The combined output value generation unit 50 includes a multiplier 51, a subtractor 52, and a D-flip-flop 53. Although only one D-flip-flop 32 and one D-flip-flop 53 are shown in FIG. 3 for simplification of illustration, M D-flip-flops 32 and N D-flip-flops 53 are actually present.

The counter 31 counts the number of edges of the reference periodic signal CLK. In the embodiment, the counter 31 counts the number of rising edges of the reference periodic signal CLK and outputs M-bit count data CNT.

The M D-flip-flops 32 acquire and hold the M-bit count data CNT in synchronization with the measurement target signal TRG. In the embodiment, the M D-flip-flops 32 acquire the M-bit count data CNT and hold the M-bit count data CNT as the M-bit count data DCNT in synchronization with the rising edge and the falling edge of the measurement target signal TRG. Specifically, the M D-flip-flops 32 acquire the count data CNT when the rising edge of the measurement target signal TRG arrives, and hold the count data CNT as the count data DCNT until the falling edge of the measurement target signal TRG arrives. The M D-flip-flops 32 acquire the count data CNT when the falling edge of the measurement target signal TRG arrives, and hold the count data CNT as the count data DCNT until the rising edge of the measurement target signal TRG arrives.

The multiplier 51 multiplies the M-bit count data DCNT by an integer $N_p$. That is, the multiplier 51 outputs N-bit data that is $N_p$ times the count data DCNT. When the integer $N_p$ is 2 to the n-th power, the multiplier 51 can be implemented as a simple circuit that shifts the count data DCNT by n bits.

The subtractor 52 subtracts the N-bit time digital data TD output from the time digital value generation unit 40 from the N-bit data output from the multiplier 51, and outputs N-bit time stamp data TS.

The N D-flip-flops 53 acquire and hold the N-bit time stamp data TS in synchronization with the measurement target signal TRG. In the embodiment, when the rising edge or the falling edge of the measurement target signal TRG arrives, the N D-flip-flops 53 acquire the N-bit time stamp data TS and hold the N-bit time stamp data TS as the N-bit combined output data DTS. Each of the values included in the combined output data DTS is a reciprocal count value, and is a value corresponding to a time from the rising edge to the next falling edge of the measurement target signal TRG or a time from the falling edge to the next rising edge of the measurement target signal TRG. That is, each of the values included in the combined output data DTS increases as a time between two consecutive edges of the measurement target signal TRG increases, and decreases as a time between two consecutive edges of the measurement target signal TRG decreases.

FIG. 4 is a diagram showing a configuration example of the time digital value generation unit 40. As shown in FIG. 4, the time digital value generation unit 40 includes a control unit 41, an oscillation unit 42, a counter 43, a D-flip-flop 44, an adder 45, and a D-flip-flop 46. Although only one D-flip-flop 44 and one D-flip-flop 46 are shown in FIG. 4 for simplification of illustration, K D-flip-flops 44 and N D-flip-flops 46 are actually present.

The control unit 41 detects the rising edge and the falling edge of the measurement target signal TRG, activates an enable signal EN, and outputs the enable signal EN. In the embodiment, the enable signal EN is active at a high level. After setting the enable signal EN to the high level, the control unit 41 switches, based on count data CT output from the counter 43, the enable signal EN from the high level to a low level when the number of rising edges of a clock signal CK output from the oscillation unit 42 reaches a predetermined number. After switching the enable signal EN from the high level to the low level, when the rising edge of the reference periodic signal CLK arrives a predetermined number of times, the control unit 41 activates a reset signal RST1 and outputs the reset signal RST1. In the embodiment, the reset signal RST1 is active at a high level. The control unit 41 switches the reset signal RST1 from the high level to a low level when a predetermined time elapses after the reset signal RST1 is set to the high level. After the enable signal EN is set to the high level, when the first rising edge of the reference periodic signal CLK arrives, the control unit 41 activates a reset signal RST2 and outputs the reset signal RST2. In the embodiment, the reset signal RST2 is active at a high level. The control unit 41 switches the reset signal RST2 from the high level to a low level when a predetermined time elapses after the reset signal RST2 is set to the high level. The enable signal EN is supplied to the oscillation unit 42, the reset signal RST1 is supplied to the counter 43 and the K D-flip-flops 44, and the reset signal RST2 is supplied to the N D-flip-flops 46.

The oscillation unit 42 oscillates when the enable signal EN is at the high level, and stops the oscillation when the enable signal EN is at the low level. For example, as shown in FIG. 5, the oscillation unit 42 includes a two-input AND circuit 47 and a logic inversion circuit 48. The AND circuit 47 receives the enable signal EN and an output signal of the logic inversion circuit 48, and outputs an AND signal of the enable signal EN and the output signal of the logic inversion circuit 48. The logic inversion circuit 48 receives an output signal of the AND circuit 47, and outputs a logic inversion signal of the output signal of the AND circuit 47.

The counter 43 counts the number of edges of the clock signal CK. In the embodiment, when the reset signal RST1 is at the low level, the counter 43 counts the number of rising edges of the clock signal CK and outputs the K-bit count data CT. When the reset signal RST1 is at the high level, the counter 43 initializes the count data CT to zero.

The K D-flip-flops 44 acquire and hold the K-bit count data CT in synchronization with the reference periodic signal CLK. In the embodiment, when the reset signal RST1 is at the low level and the rising edge of the reference periodic signal CLK arrives, the K D-flip-flops 44 acquire the K-bit count data CT and hold the K-bit count data CT as K-bit count data DCT. The K D-flip-flops 44 initialize the count data DCT to zero when the reset signal RST1 is at the high level.

The adder 45 adds the N-bit data held and output by the N D-flip-flops 46 and the K-bit count data DCT held by the K D-flip-flops 44, and outputs N-bit addition data.

The N D-flip-flops 46 acquire and hold the addition data output from the adder 45 in synchronization with the reference periodic signal CLK. In the embodiment, when the reset signal RST2 is at the low level and the rising edge of the reference periodic signal CLK arrives, the N D-flip-flops 46 acquire the N-bit addition data output from the adder 45 and hold the N-bit addition data as the N-bit time digital data TD. The N D-flip-flops 46 initialize the time digital data TD to zero when the reset signal RST2 is at the high level.

The time digital value generation unit 40 configured as described above generates the first to n-th time digital values $TD_1$ to $TD_n$ by a EATDC method in which the count data DCT whose value increases in synchronization with the reference periodic signal CLK is integrated. ATDC is an abbreviation of an accumulated time to digital convert.

Figure 6:
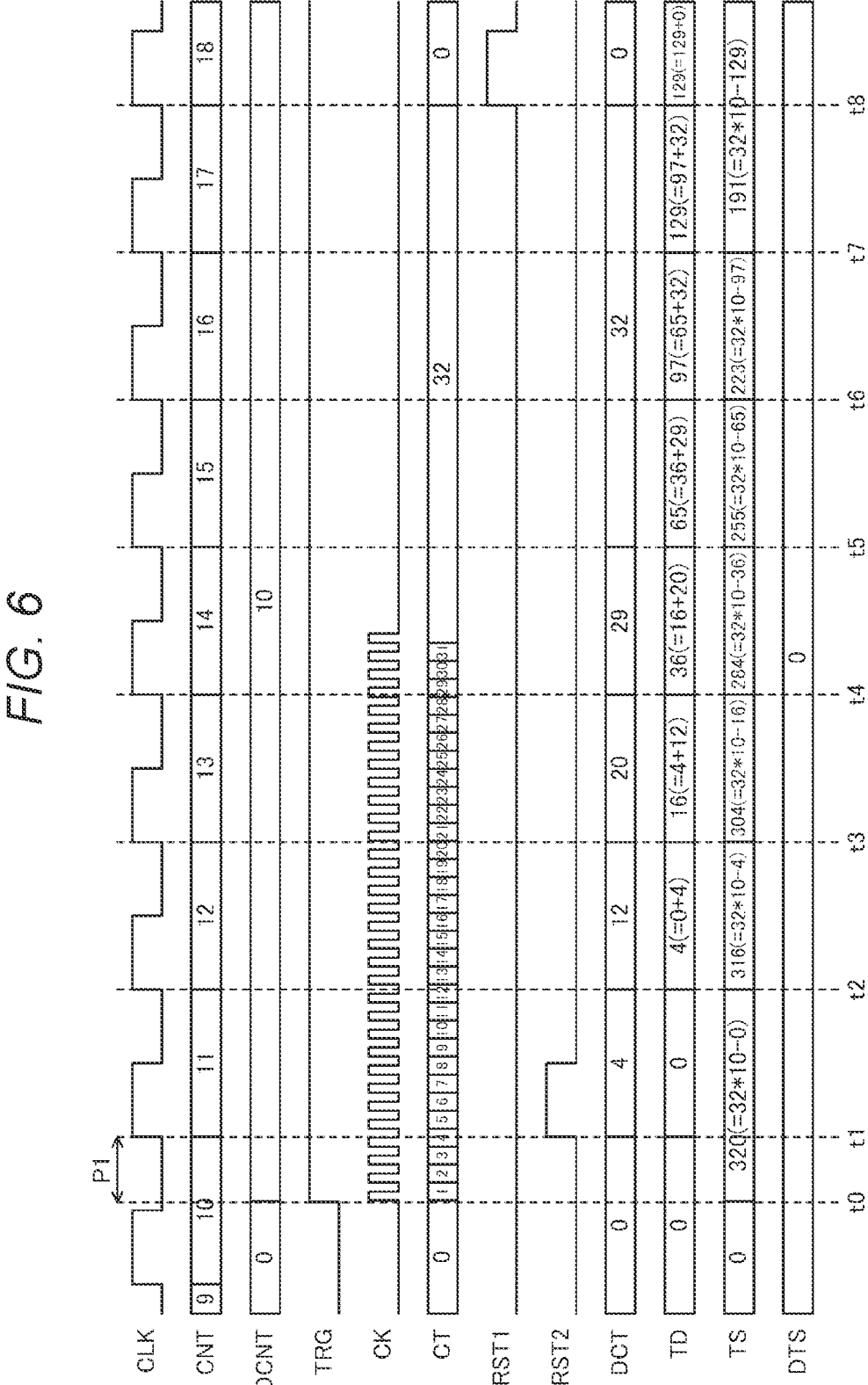
FIG. 6 is a timing chart showing an example of operations of the count unit, the time digital value generation unit, and the combined output value generation unit according to the first embodiment.
Figure 7:
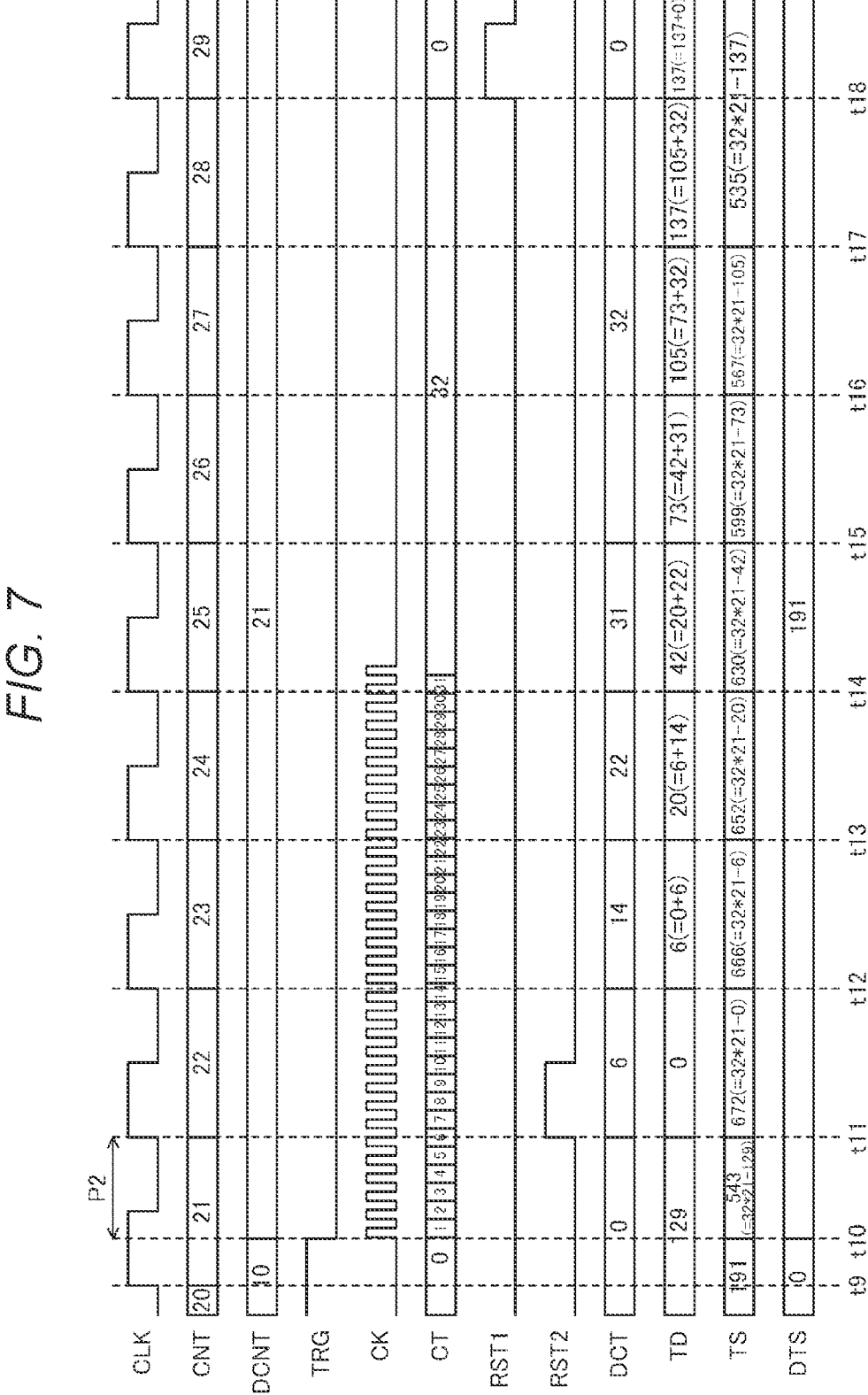
FIG. 7 is a timing chart showing an example of operations of the count unit, the time digital value generation unit, and the combined output value generation unit according to the first embodiment.

Next, detailed operations of the count unit 30, the time digital value generation unit 40, and the combined output value generation unit 50 will be described with reference to FIGS. 6 and 7. FIGS. 6 and 7 are timing charts showing an example of the operations of the count unit 30, the time digital value generation unit 40, and the combined output value generation unit 50. In the examples of FIGS. 6 and 7, the integer $N_p$ input to the multiplier 51 in the combined output value generation unit 50 is 32.

As shown in FIG. 6, the count data CNT increases by one each time the rising edge of the reference periodic signal CLK arrives. At a time point t0, when the measurement target signal TRG transitions from the low level to the high level, since the count data CNT at this time is 10, the count data DCNT changes from 0 to 10, and the time stamp data TS changes from 0 to 320. For example, a value 10 of the count data DCNT corresponds to the above-described first count value $DCNT_1$. When the measurement target signal TRG transitions from the low level to the high level, the oscillation of the oscillation unit 42 starts, and the count data CT increases by one each time the rising edge of the clock signal CK arrives.

At a time point t1 when a time P1 has elapsed from the time point t0, the first rising edge of the reference periodic signal CLK after the measurement target signal TRG has transitioned to the high level arrives, and the count data DCT changes from 0 to 4 in synchronization with the edge. The reset signal RST2 transitions from the low level to the high level and the time digital data TD is initialized to 0 in synchronization with the edge. Thereafter, the reset signal RST2 transitions from the high level to the low level, and an initialization operation of the time digital data TD is released.

At a time point t2, a second rising edge of the reference periodic signal CLK arrives, and the count data DCT changes from 4 to 12 and the time digital data TD changes from 0 to 4 in synchronization with the edge. The time stamp data TS changes from 320 to 316 in synchronization with the edge.

At a time point t3, a third rising edge of the reference periodic signal CLK arrives, and the count data DCT changes from 12 to 20 and the time digital data TD changes from 4 to 16 in synchronization with the edge. The time stamp data TS changes from 316 to 304 in synchronization with the edge.

At a time point t4, a fourth rising edge of the reference periodic signal CLK arrives, and the count data DCT changes from 20 to 29 and the time digital data TD changes from 16 to 36 in synchronization with the edge. The time stamp data TS changes from 304 to 284 in synchronization with the edge. Thereafter, when the count data CT reaches 32, the oscillation of the oscillation unit 42 stops, and the count data CT is held at 32.

At a time point t5, a fifth rising edge of the reference periodic signal CLK arrives, and the count data DCT changes from 29 to 32 and the time digital data TD changes from 36 to 65 in synchronization with the edge. The time stamp data TS changes from 284 to 255 in synchronization with the edge.

At a time point t6, a sixth rising edge of the reference periodic signal CLK arrives, and the time digital data TD changes from 65 to 97 and the time stamp data TS changes from 255 to 223 in synchronization with the edge. The count data DCT remains at 32.

At a time point t7, a seventh rising edge of the reference periodic signal CLK arrives, and the time digital data TD changes from 97 to 129 and the time stamp data TS changes from 223 to 191 in synchronization with the edge. The count data DCT remains at 32.

At a time point t8, an eighth rising edge of the reference periodic signal CLK arrives, the reset signal RST1 transitions from the low level to the high level, and the count data CT and the count data DCT are initialized to 0 in synchronization with the edge. Since the count data CT changes from 32 to 0, the time digital data TD remains at 129, and the time stamp data TS remains at 191. For example, a value 129 of the time digital data TD corresponds to the above-described first time digital value $TD_1$. Thereafter, the reset signal RST1 transitions from the high level to the low level, and the initialization of the count data CT and the count data DCT is released.

Thereafter, after the elapse of time, as shown in FIG. 7, at a time point t9, an eleventh rising edge of the reference periodic signal CLK arrives, and the count data CNT changes from 20 to 21. At a time point t10, when the measurement target signal TRG transitions from the high level to the low level, since the time stamp data TS at this time is 191, the combined output data DTS changes from 0 to 191. For example, a value 191 of the combined output data DTS corresponds to the above-described first combined output value $DTS_1$. Since the count data CNT is 21 when the measurement target signal TRG transitions from the high level to the low level, the count data DCNT changes from 10 to 21 and the time stamp data TS changes from 191 to 543. For example, a value 21 of the count data DCNT corresponds to the above-described second count value $DCNT_2$. When the measurement target signal TRG transitions from the high level to the low level, the oscillation of the oscillation unit 42 starts, and the count data CT increases by one each time the rising edge of the clock signal CK arrives.

At a time point t11 when a time P2 has elapsed from the time point t10, a twelfth rising edge of the reference periodic signal CLK arrives, and the count data DCT changes from 0 to 6 in synchronization with the edge. The reset signal RST2 transitions from the low level to the high level, the time digital data TD is initialized to 0, and the time stamp data TS changes from 543 to 672 in synchronization with the edge. Thereafter, the reset signal RST2 transitions from the high level to the low level, and the initialization operation of the time digital data TD is released.

At a time point t12, a thirteenth rising edge of the reference periodic signal CLK arrives, and the count data DCT changes from 6 to 14 and the time digital data TD changes from 0 to 6 in synchronization with the edge. The time stamp data TS changes from 672 to 666 in synchronization with the edge.

At a time point t13, a fourteenth rising edge of the reference periodic signal CLK arrives, and the count data DCT changes from 14 to 22 and the time digital data TD changes from 6 to 20 in synchronization with the edge. The time stamp data TS changes from 666 to 652 in synchronization with the edge.

At a time point t14, a fifteenth rising edge of the reference periodic signal CLK arrives, and the count data DCT changes from 22 to 31 and the time digital data TD changes from 20 to 42 in synchronization with the edge. The time stamp data TS changes from 652 to 630 in synchronization with the edge. Thereafter, when the count data CT reaches 32, the oscillation of the oscillation unit 42 stops, and the count data CT is held at 32.

At a time point t15, a sixteenth rising edge of the reference periodic signal CLK arrives, and the count data DCT changes from 31 to 32 and the time digital data TD changes from 42 to 73 in synchronization with the edge. The time stamp data TS changes from 630 to 599 in synchronization with the edge.

At a time point t16, a seventeenth rising edge of the reference periodic signal CLK arrives, and the time digital data TD changes from 73 to 105 and the time stamp data TS changes from 599 to 567 in synchronization with the edge. The count data DCT remains at 32.

At a time point t17, an eighteenth rising edge of the reference periodic signal CLK arrives, and the time digital data TD changes from 105 to 137 and the time stamp data TS changes from 567 to 535 in synchronization with the edge. The count data DCT remains at 32.

At a time point t18, a nineteenth rising edge of the reference periodic signal CLK arrives, the reset signal RST1 transitions from the low level to the high level, and the count data CT and the count data DCT are initialized to 0 in synchronization with the edge. Since the count data CT changes from 32 to 0, the time digital data TD remains at 137, and the time stamp data TS remains at 535. For example, a value 137 of the time digital data TD corresponds to the above-described second time digital value $TD_2$. Thereafter, the reset signal RST1 transitions from the high level to the low level, and the initialization of the count data CT and the count data DCT is released.

Here, the time P2 from the time point t10 to the time point t11 shown in FIG. 7 is longer than the time P1 from the time point t0 to the time point t1 shown in FIG. 6. The time digital data TD at each time point from the time point t12 to the time point t18 transitions to a value larger than the time digital data TD at each time point from the time point t2 to the time point t8. Accordingly, the longer the time interval between the edge of the measurement target signal TRG and the rising edge of the reference periodic signal CLK, the larger the value of the time digital data TD. The time digital data TD after the change at the time point t7, that is, 129, which is the first time digital value $TD_1$, corresponds to the time P1, and the time digital data TD after the change at the time point t17, that is, 137, which is the second time digital value $TD_2$, corresponds to the time P2.

In the examples of FIGS. 6 and 7, when a time of one cycle of the reference periodic signal CLK is set to T, a time during which the measurement target signal TRG is at the high level is $T\times(21-10)+P1-P2=(T\times21-P2)-(T\times10-P1)$. Here, the time stamp data TS after the change at the time point t7, that is, 191 (=32×10−129) corresponds to (T×10−P1) and is the first combined output value $DTS_1$. The time stamp data TS after the change at the time point t17, that is, 535 (=32×21−137) corresponds to (T×21−P2) and is the second combined output value $DTS_2$. Accordingly, a difference between the second combined output value $DTS_2$ and the first combined output value $DTS_1$, that is, 344 (=535−191) corresponds to a time during which the measurement target signal TRG is at the high level, that is, a time interval between the rising edge and the falling edge of the measurement target signal TRG.

In general, the i-th combined output value $DTS_i$ corresponds to a time interval between the i-th edge and the (i+1)-th edge of the measurement target signal TRG. Accordingly, the external device can calculate the frequency of the measurement target signal TRG based on the measurement data DO generated using the first to n-th combined output values $DTS_1$ to $DTS_n$, and measure the physical quantity detected by the physical quantity sensor 10.

Figure 8:
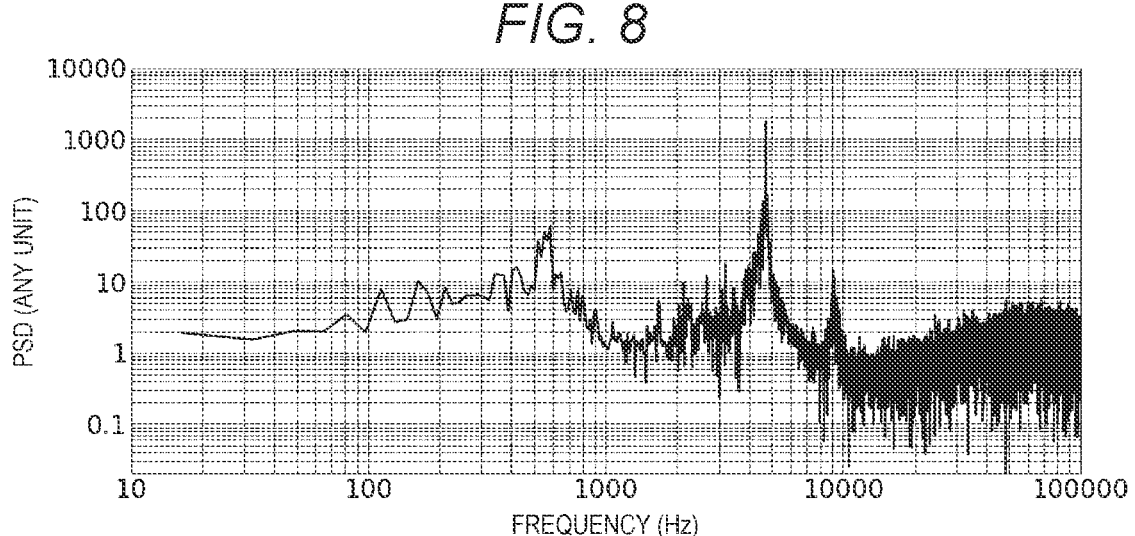
FIG. 8 is a diagram showing an example of a frequency spectrum of combined output data.

Here, as shown in FIGS. 6 and 7, in a period in which the first to n-th combined output values $DTS_1$ to $DTS_n$ are generated, the count data CNT increases by one each time the rising edge of the reference periodic signal CLK arrives without stopping the reference periodic signal CLK. Accordingly, a quantization error of the first combined output value $DTS_1$ is fed back to the generation of the second combined output value $DTS_2$. In general, a quantization error of the j-th combined output value $DTS_j$ is fed back to the generation of the (j+1)-th combined output value $DTS_{j+1}$. j is an integer of 1 or more and n−1 or less. That is, since the combined output data DTS including the first to n-th combined output values $DTS_1$ to $DTS_n$ satisfies a property of a delta-sigma modulation signal, a noise shaping effect is obtained, and the quantization error is shifted to a high-frequency band. FIG. 8 is a diagram showing an example of a frequency spectrum of the combined output data DTS. A horizontal axis represents a frequency, and a vertical axis represents a power spectral density. In the example of FIG. 8, an average frequency at which the first to n-th combined output values $DTS_1$ to $DTS_n$ are generated is about 266 kHz, and an upper limit of a frequency band which is defined by a specification and in which the physical quantity is detectable is 1 kHz. In the example of FIG. 8, the quantization error is shifted to a frequency band of 10 kHz or more, and a noise component in a band of 1 kHz or less, which is the frequency band of the physical quantity, is reduced. Accordingly, the external device can measure the physical quantity with high accuracy based on the measurement data DO.

Here, according to a sampling theorem, a period $T_{min}=1/f_{max}$ of the change in the physical quantity when the frequency, at which the physical quantity applied to the physical quantity sensor 10 changes, is a maximum frequency $f_{max}$ in a frequency band F which is defined by the specification and in which the physical quantity is detectable, is required to be twice or more periods $T_1$ to $T_n$ in which the first to n-th combined output values $DTS_1$ to $DTS_n$ are generated. The frequency band F is appropriately determined based on restrictions such as a maximum frequency at which the physical quantity sensor 10 can detect the physical quantity and a maximum transfer rate of the measurement data DO to the external device.

However, when an average period of the periods $T_1$ to $T_n$ is set to $T_{avg}$ and a ratio of the period $T_{min}$ to the average period $T_{avg}$ is small, the measurement accuracy of the physical quantity obtained by the external device may be reduced. Therefore, a relationship between the ratio of the period $T_{min}$ to the average period $T_{avg}$ and the measurement accuracy of the physical quantity will be considered with reference to FIGS. 9 and 10.

Figure 9:
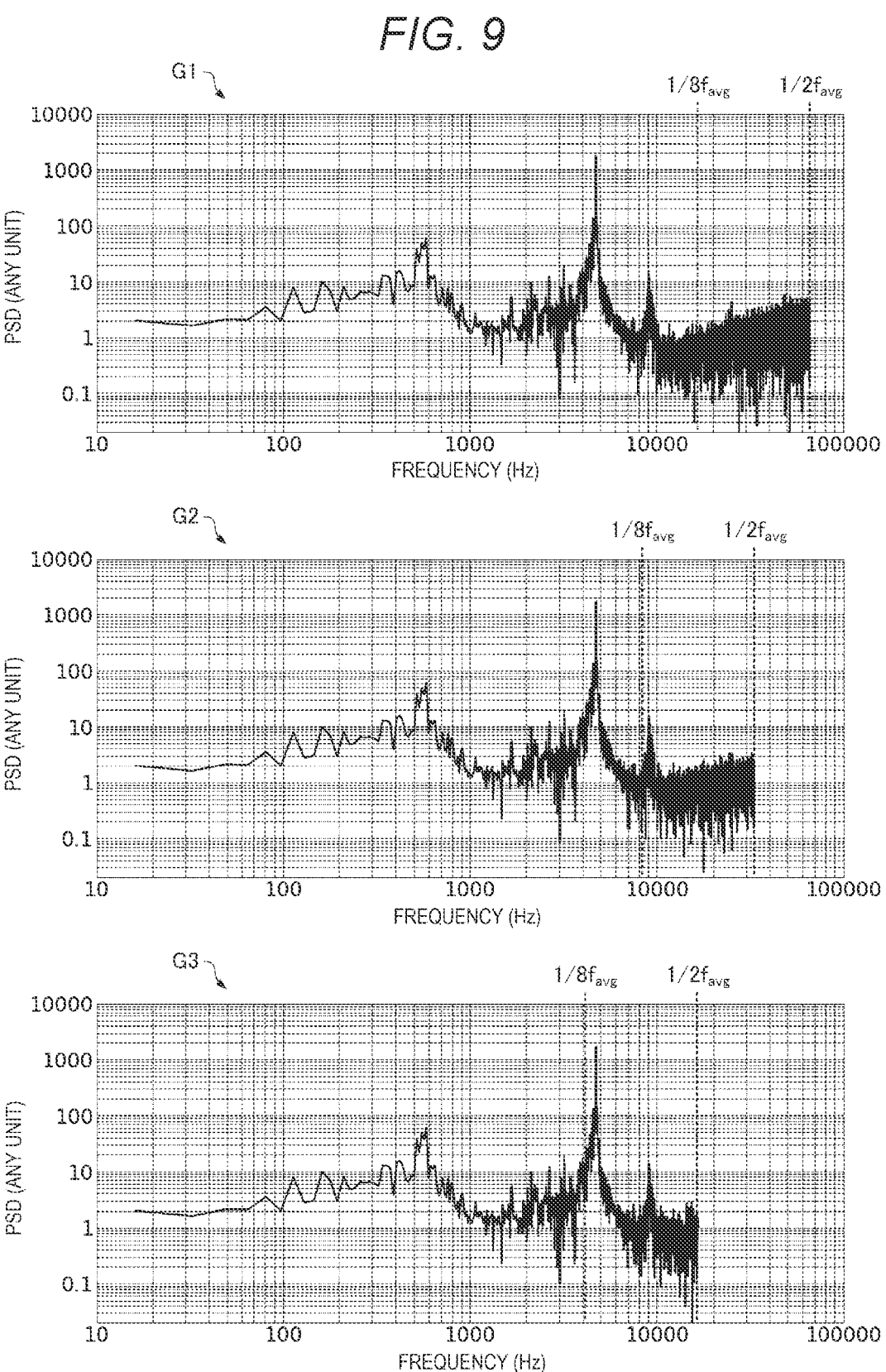
FIG. 9 is a diagram for considering a relationship between a ratio of a minimum period of a change in a physical quantity to an average period, in which a combined output value is generated, and measurement accuracy of the physical quantity.

G1, G2, and G3 in FIG. 9 respectively indicate the frequency spectra of the combined output data DTS when an average frequency $f_{avg}$ at which the first to n-th combined output values $DTS_1$ to $DTS_n$ are generated is set to ½, ¼, and ⅛ of about 266 kHz which is the average frequency $f_{avg}$ in the example of FIG. 8. G4, G5, and G6 in FIG. 10 respectively indicate the frequency spectra of the combined output data DTS when the average frequency $f_{avg}$ at which the first to n-th combined output values $DTS_1$ to $DTS_n$ are generated is set to 1/16, 1/32, and 1/64 of about 266 kHz which is the average frequency $f_{avg}$ in the example of FIG. 8.

In FIG. 9, in G1, the average frequency $f_{avg}$ is about 266 kHz×½, and when the frequency band from ⅛$f_{avg}$ to ½$f_{avg}$ indicated by broken lines is compared with that in FIG. 8, noise due to the quantization error increases. In G2, the average frequency $f_{avg}$ is about 266 kHz×¼, and when the frequency band from ⅛$f_{avg}$ to ½$f_{avg}$ indicated by broken lines is compared with that in FIG. 8, noise due to the quantization error increases, and a range on a right side of a peak in the vicinity of 9 kHz is affected. In G3, the average frequency $f_{avg}$ is about 266 kHz×⅛, and when the frequency band from ⅛$f_{avg}$ to ½$f_{avg}$ indicated by broken lines is compared with that in FIG. 8, ranges on both sides of the peak in the vicinity of 9 kHz are affected. On the other hand, in any of G1, G2, and G3, when the frequency band equal to or less than ⅛$f_{avg}$ is compared with that in FIG. 8, there is almost no difference.

Figure 10:
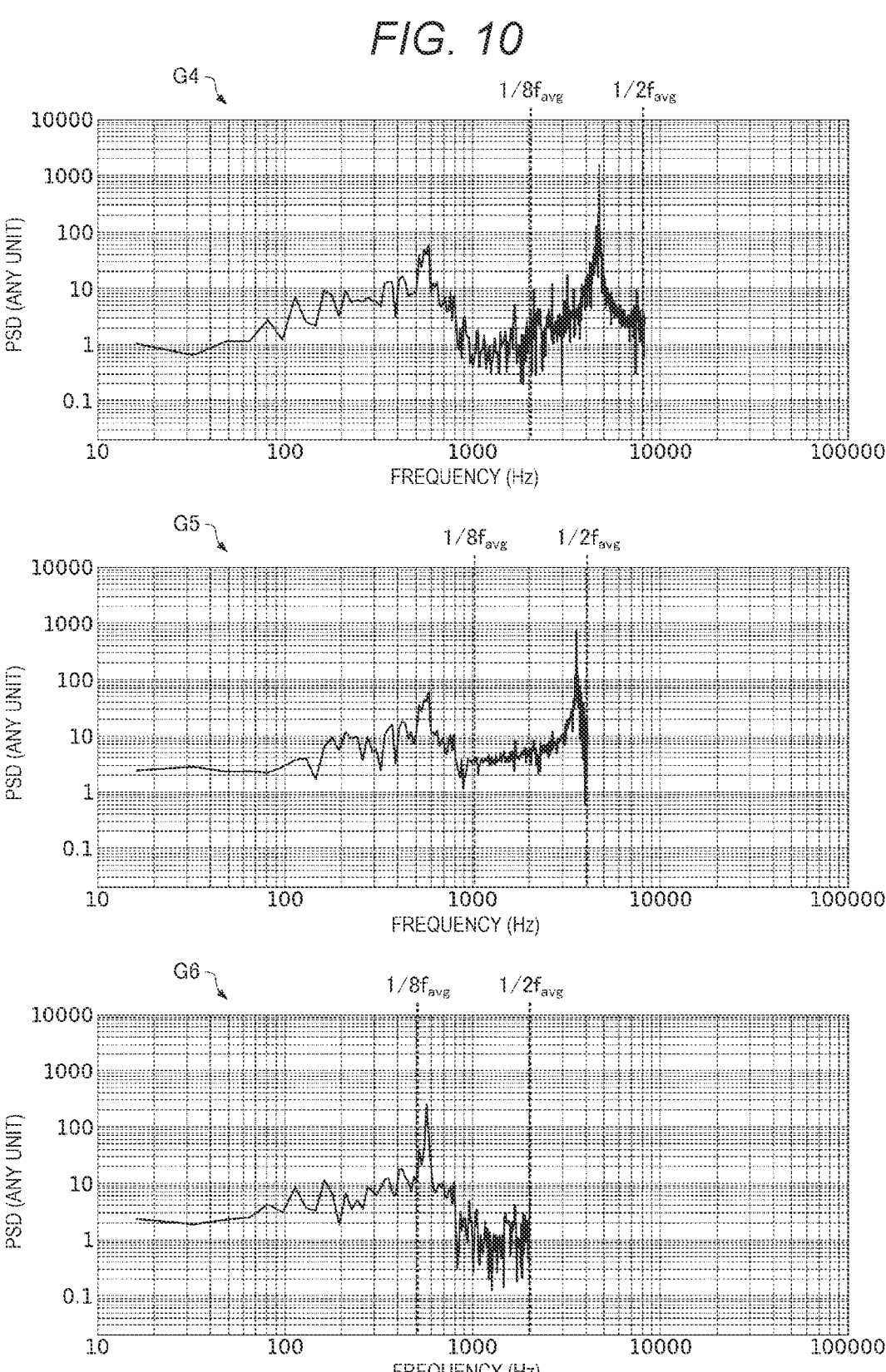
FIG. 10 is a diagram for considering a relationship between the ratio of the minimum period of the change in the physical quantity to the average period, in which the combined output value is generated, and the measurement accuracy of the physical quantity.

In FIG. 10, in G4, the average frequency $f_{avg}$ is about 266 kHz×1/16, and when the frequency band from ⅛$f_{avg}$ to ½$f_{avg}$ indicated by broken lines is compared with that in FIG. 8, a range on a right side of a peak in the vicinity of 5 kHz is affected. In G5, the average frequency $f_{avg}$ is about 266 kHz×1/32, and when the frequency band from ⅛$f_{avg}$ to ½$f_{avg}$ indicated by broken lines is compared with that in FIG. 8, a peak due to folding of a signal outside the band is generated between 3 kHz and 4 kHz, and a signal level in a range of the peak increases. In G6, the average frequency $f_{avg}$ is about 266 kHz×1/64, and when the frequency band from ⅛$f_{avg}$ to ½$f_{avg}$ indicated by broken lines is compared with that in FIG. 8, a signal level between 500 Hz and 600 Hz is affected. On the other hand, in any of G4, G5, and G6, when the frequency band equal to or less than ⅛$f_{avg}$ is compared with that in FIG. 8, there is almost no difference.

From the above consideration, it can be said that the external device can accurately measure the physical quantity based on the measurement data DO as long as the frequency of the physical quantity detected by the physical quantity sensor 10 is included in a frequency band lower than ⅛ of the average frequency $f_{avg}$ at which the first to n-th combined output values $DTS_1$ to $DTS_n$ are generated. Accordingly, in the embodiment, the period $T_{min}=1/f_{max}$ of the change in the physical quantity when the frequency, at which the physical quantity changes, is the maximum frequency $f_{max}$ in the frequency band F which is defined by the specification and in which the physical quantity is detectable, is longer than eight times the average period $T_{avg}$ in which the first to n-th combined output values $DTS_1$ to $DTS_n$ are generated. However, as the ratio of the period $T_{min}$ to the average period $T_{avg}$ increases, the measurement accuracy of the physical quantity is improved, but a circuit area and power consumption of the sensor module 1 increase. Therefore, the ratio may be eight times or more, and may be as small as possible within a range in which the measurement accuracy is allowed.

As described above, the sensor module 1 according to the first embodiment generates the first to n-th count values $DCNT_1$ to $DCNT_n$ and the first to n-th time digital values $TD_1$ to $TD_n$ which are digital values without performing analog signal processing on the measurement target signal TRG output from the physical quantity sensor 10, and generates the first to n-th combined output values $DTS_1$ to $DTS_n$ based on the first to n-th count values $DCNT_1$ to $DCNT_n$ and the first to n-th time digital values $TD_1$ to $TD_n$. Accordingly, according to the sensor module 1 of the first embodiment, even when the measurement target signal TRG includes a frequency components generated due to high-frequency electromagnetic vibration noise generated in the measurement target object to which the physical quantity sensor 10 is attached and a higher harmonic components of the frequency components, the sensor module 1 is hardly affected by the high-frequency electromagnetic vibration noise since an analog circuit which is easily affected by high-frequency noise is not necessary. According to the sensor module 1 of the first embodiment, it is not necessary to remove the frequency components generated due to the high-frequency electromagnetic vibration noise and the higher harmonic components of the frequency components from the measurement target signal TRG, and thus a circuit scale is reduced.

In the sensor module 1 according to the first embodiment, the quantization error of the j-th combined output value $DTS_j$ is fed back to the generation of the (j+1)-th combined output value $DTS_{j+1}$, and thus the first to n-th combined output values $DTS_1$ to $DTS_n$ satisfy the property of the delta-sigma modulation signal, the noise shaping effect is obtained, and the quantization error is shifted to the high-frequency band. Accordingly, according to the sensor module 1 of the first embodiment, an S/N ratio of a physical quantity component calculated based on the first to n-th combined output values $DTS_1$ to $DTS_n$ is improved, and the measurement accuracy of the physical quantity obtained by the external device is improved.

In general, since there is a difference in measurement accuracy between the direct counting method and the reciprocal counting method, it is necessary to select an optimum counting method according to a relationship between the frequency band of the measurement target signal and the frequency of the reference periodic signal. However, according to the sensor module 1 of the first embodiment, the first to n-th combined output values $DTS_1$ to $DTS_n$ satisfy the property of the delta-sigma modulation signal, and thus the same measurement accuracy can be obtained in both methods. Therefore, the counting method can be selected without considering the restriction of the measurement accuracy. For example, in the count unit 30, as compared with a configuration in which a time event of a signal having a longer period in the measurement target signal TRG and the reference periodic signal CLK is counted in synchronization with a signal having a shorter period, by adopting a configuration in which a time event of the signal having the shorter period is counted in synchronization with the signal having the longer period, it is possible to lower an operation frequency, it is possible to reduce the power consumption while maintaining the measurement accuracy.

According to the sensor module 1 of the first embodiment, since the period $T_{min}$ of the change in the physical quantity when the frequency, at which the physical quantity applied to the physical quantity sensor 10 changes, is the maximum frequency $f_{max}$ in the frequency band F of the physical quantity is longer than eight times the average period $T_{avg}$ in which the first to n-th combined output values $DTS_1$ to $DTS_n$ are generated, various bad influences due to spuriousness, aliasing, or the like can be reduced to an allowable level or less in a realistic time.

The sensor module 1 according to the first embodiment generates the first to n-th combined output values $DTS_1$ to $DTS_n$ at the timings of the rising edge and the falling edge of the measurement target signal TRG. Accordingly, according to the sensor module 1 of the first embodiment, since two combined output values per cycle of the measurement target signal TRG is generated, the first to n-th combined output values can be generated at a rate twice the frequency of the measurement target signal TRG.

According to the sensor module 1 of the first embodiment, since n/2 combined output values corresponding to the time at the high level of the measurement target signal TRG and n/2 combined output values corresponding to the time at the low level of the measurement target signal TRG are obtained, the external device can calculate a duty ratio of the measurement target signal TRG based on the first to n-th combined output values $DTS_1$ to $DTS_n$. Accordingly, for example, by adjusting the oscillation circuit provided in the physical quantity sensor 10 such that the duty ratio of the measurement target signal TRG is 50:50, the external device can reduce the noise component included in the measurement target signal TRG by reducing distortion of the measurement target signal TRG.

According to the sensor module 1 of the first embodiment, in the filter unit 60, various types of signal processing can be performed on the first to n-th combined output values $DTS_1$ to $DTS_n$. A sample rate can be reduced by, for example, the filter unit 60 performing the decimation processing, so that power consumption of a circuit in a stage subsequent to the filter unit 60 can be reduced. In particular, when a signal component of a measurement target included in the measurement target signal TRG is present in a low-frequency band, an amount of data can be effectively reduced by increasing a decimation ratio. The combined output values corresponding to the time at the high level of the measurement target signal TRG and the combined output values corresponding to the time at the low level of the measurement target signal TRG are averaged by, for example, the filter unit 60 performing the moving average processing of the even number taps, so that the noise component generated due to the duty ratio included in the measurement target signal TRG can be reduced.

2. Second Embodiment

Hereinafter, in the sensor module 1 according to a second embodiment, the same components as those in the first embodiment are denoted by the same reference numerals, the description overlapping with the first embodiment is omitted or simplified, and contents different from those in the first embodiment will be mainly described.

Since a configuration of the sensor module 1 according to the second embodiment is the same as that in FIG. 1, the illustration and description thereof are omitted. However, in the second embodiment, the specific configurations of the time digital value generation unit 40 and the combined output value generation unit 50 are different from those of the first embodiment.

FIG. 11 is a diagram showing a configuration example of the count unit 30 and the combined output value generation unit 50 according to the second embodiment. As shown in FIG. 11, since the configuration of the count unit 30 is the same as that in FIG. 3, the description thereof will be omitted.

The combined output value generation unit 50 includes the multiplier 51, an adder 54, and the N D-flip-flops 53. That is, the combined output value generation unit 50 shown in FIG. 11 is different from the combined output value generation unit 50 shown in FIG. 3 in that the subtractor 52 is replaced with the adder 54. The adder 54 adds the N-bit data output from the multiplier 51 and the N-bit time digital data TD output from the time digital value generation unit 40, and outputs the N-bit time stamp data TS. Other configurations of the combined output value generation unit 50 are the same as those in FIG. 3, and the description thereof is omitted.

FIG. 12 is a diagram showing a configuration example of the time digital value generation unit 40 according to the second embodiment. As shown in FIG. 12, the time digital value generation unit 40 according to the second embodiment includes a multiphase clock generation unit 81, D-flip-flops 82, 83, and 84, and a time digital value calculation unit 85.

The multiphase clock generation unit 81 outputs a first clock signal CLK90, a second clock signal CLK180, and a third clock signal CLK270 which are respectively obtained by delaying a phase of the reference periodic signal CLK by 90°, 180°, and 270°.

The D-flip-flop 82 acquires and holds the first clock signal CLK90 in synchronization with the measurement target signal TRG. In the embodiment, the D-flip-flop 82 acquires the first clock signal CLK90 and holds the first clock signal CLK90 as first data D90 in synchronization with the rising edge and the falling edge of the measurement target signal TRG.

The D-flip-flop 83 acquires and holds the second clock signal CLK180 in synchronization with the measurement target signal TRG. In the embodiment, the D-flip-flop 83 acquires the second clock signal CLK180 and holds the second clock signal CLK180 as second data D180 in synchronization with the rising edge and the falling edge of the measurement target signal TRG.

The D-flip-flop 84 acquires and holds the third clock signal CLK270 in synchronization with the measurement target signal TRG. In the embodiment, the D-flip-flop 84 acquires the third clock signal CLK270 and holds the third clock signal CLK270 as third data D270 in synchronization with the rising edge and the falling edge of the measurement target signal TRG.

The time digital value calculation unit 85 calculates the first to n-th time digital values $TD_1$ to $TD_n$ in time series based on the first data D90, the second data D180, and the third data D270, and outputs the time digital data TD including the first to n-th time digital values $TD_1$ to $TD_n$.

FIG. 13 is a diagram showing an example of a truth table of the time digital value calculation unit 85. As shown in FIG. 13, when both the first data D90 and the second data D180 are at the low level and the third data D270 is at the high level, the time digital value calculation unit 85 calculates 0 as the i-th time digital value $TD_i$. i is an integer of 1 or more and n or less. When the first data D90 is at the high level and both the second data D180 and the third data D270 are at the low level, the time digital value calculation unit 85 calculates 1 as the i-th time digital value $TD_i$. When both the first data D90 and the second data D180 are at the high level and the third data D270 is at the low level, the time digital value calculation unit 85 calculates 2 as the i-th time digital value $TD_i$. When the first data D90 is at the low level and both the second data D180 and the third data D270 are at the high level, the time digital value calculation unit 85 calculates 3 as the i-th time digital value $TD_i$.

The time digital value generation unit 40 configured as described above generates the first to n-th time digital values $TD_1$ to $TD_n$ by a multiphase clock method using a plurality of clock signals obtained by shifting the phase of the reference periodic signal CLK. Although three clock signals having different phases are used in the example of FIG. 12, two or four or more clock signals having different phases may be used. The reference periodic signal CLK may be used as one of the plurality of clock signals having different phases.

Figure 14:
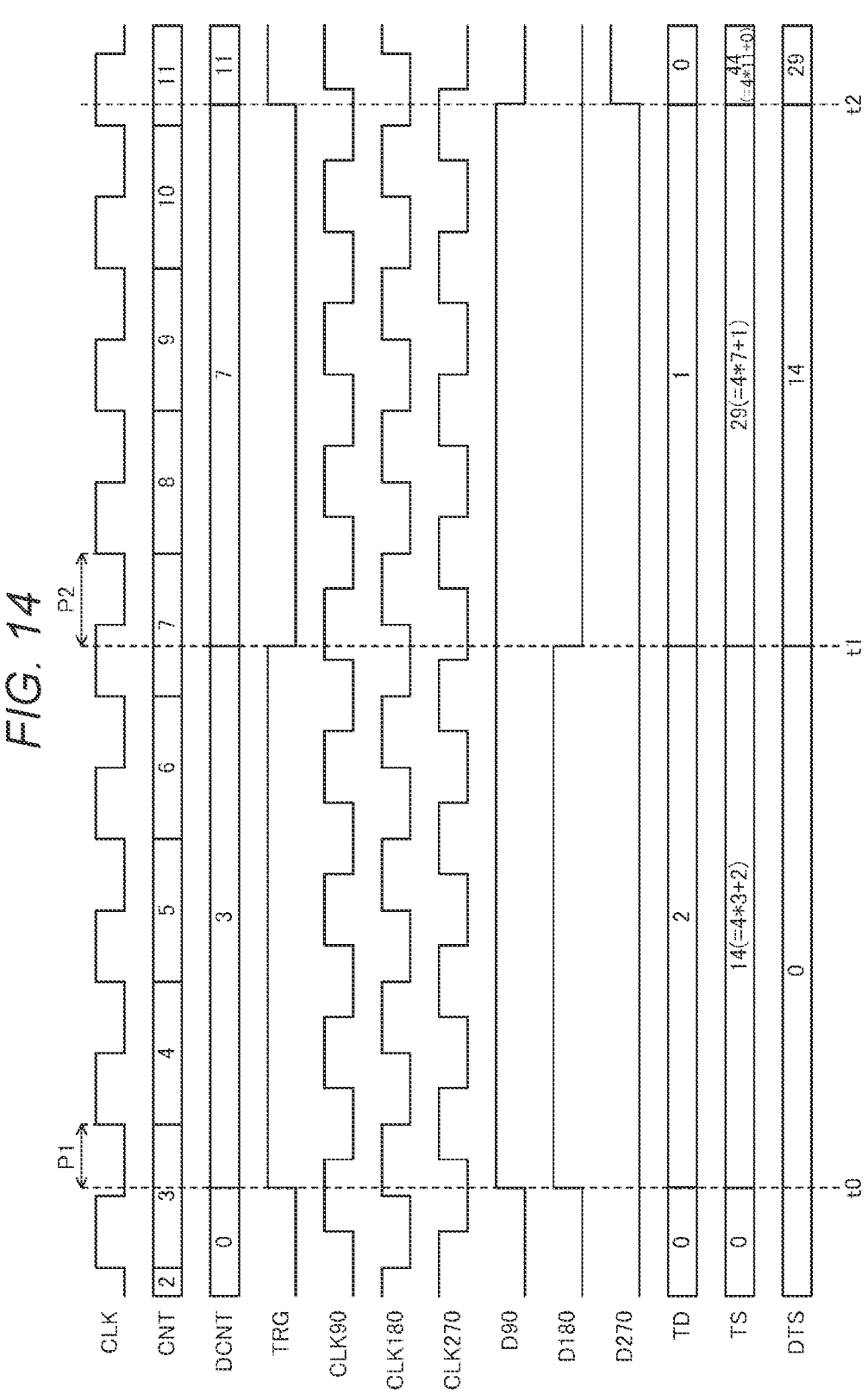
FIG. 14 is a timing chart showing an example of operations of the count unit, the time digital value generation unit, and the combined output value generation unit according to the second embodiment.

FIG. 14 is a timing chart showing an example of the operations of the count unit 30, the time digital value generation unit 40, and the combined output value generation unit 50. In the example of FIG. 14, the integer $N_p$ input to the multiplier 51 in the combined output value generation unit 50 is 4.

As shown in FIG. 14, the count data CNT increases by one each time the rising edge of the reference periodic signal CLK arrives. At a time point t0, when the measurement target signal TRG transitions from the low level to the high level, since the count data CNT at this time is 3, the count data DCNT changes from 0 to 3. For example, the value 3 of the count data DCNT corresponds to the above-described first count value $DCNT_1$. When the measurement target signal TRG changes from the low level to the high level, since the first clock signal CLK90 is at the high level, the first data D90 changes from the low level to the high level. Since the second clock signal CLK180 is at the high level, the second data D180 changes from the low level to the high level. Since the third clock signal CLK270 is at the low level, the third data D270 is maintained at the low level. As a result, the time digital data TD changes from 0 to 2, and the time stamp data TS changes from 0 to 14. For example, the value 2 of the time digital data TD corresponds to the above-described first time digital value $TD_1$.

Thereafter, at a time point t1, when the measurement target signal TRG transitions from the high level to the low level, since the time stamp data TS at this time is 14, the combined output data DTS changes from 0 to 14. For example, the value 14 of the combined output data DTS corresponds to the above-described first combined output value $DTS_1$. Since the count data CNT is 7 when the measurement target signal TRG transitions from the high level to the low level, the count data DCNT changes from 3 to 7. For example, the value 7 of the count data DCNT corresponds to the above-described second count value $DCNT_2$. When the measurement target signal TRG transitions from the high level to the low level, since the first clock signal CLK90 is at the high level, the first data D90 is maintained at the high level. Since the second clock signal CLK180 is at the low level, the second data D180 changes from the high level to the low level. Since the third clock signal CLK270 is at the low level, the third data D270 is maintained at the low level. As a result, the time digital data TD changes from 2 to 1, and the time stamp data TS changes from 14 to 29. For example, the value 1 of the time digital data TD corresponds to the above-described second time digital value $TD_2$.

Thereafter, at a time point t2, when the measurement target signal TRG transitions from the low level to the high level, since the time stamp data TS at this time is 29, the combined output data DTS changes from 14 to 29. For example, the value 29 of the combined output data DTS corresponds to the above-described second combined output value $DTS_2$. Since the count data CNT is 11 when the measurement target signal TRG changes from the low level to the high level, the count data DCNT changes from 7 to 11. For example, the value 11 of the count data DCNT corresponds to the above-described third count value $DCNT_3$. When the measurement target signal TRG changes from the low level to the high level, since the first clock signal CLK90 is at the low level, the first data D90 changes from the high level to the low level. Since the second clock signal CLK180 is at the low level, the second data D180 is maintained at the low level. Since the third clock signal CLK270 is at the high level, the third data D270 changes from the low level to the high level. As a result, the time digital data TD changes from 1 to 0, and the time stamp data TS changes from 29 to 44. For example, the value 0 of the time digital data TD corresponds to the above-described third time digital value $TD_3$.

Here, the time P2 from the time point t1 when the measurement target signal TRG transitions from the high level to the low level to when the next rising edge of the reference periodic signal CLK arrives is longer than the time P1 from the time point t0 when the measurement target signal TRG transitions from the low level to the high level to when the next rising edge of the reference periodic signal CLK arrives. On the other hand, the shorter the time interval between the edge of the measurement target signal TRG and the rising edge of the reference periodic signal CLK, the larger the value of the time digital data TD. The time digital data TD after the change at the time point t0, that is, 2, which is the first time digital value $TD_1$, corresponds to the time P1, and the time digital data TD after the change at the time point t1, that is, 1, which is the second time digital value $TD_2$, corresponds to the time P2.

In the example of FIG. 14, when a time of one cycle of the reference periodic signal CLK is set to T, a time during which the measurement target signal TRG is at the high level is $T \times (7-3) + P1 - P2 = (T \times 7 - P2) - (T \times 3 - P1)$. Here, the time stamp data TS after the change at the time point t0, that is, 14 (=4×3+2) corresponds to (T×3−P1), and is the first combined output value $DTS_1$. The time stamp data TS after the change at the time point t1, that is, 29 (=4×7+1) corresponds to (T×7−P2), and is the second combined output value $DTS_2$. Accordingly, a difference between the second combined output value $DTS_2$ and the first combined output value $DTS_1$, that is, 15 (=29−14) corresponds to a time during which the measurement target signal TRG is at the high level, that is, a time interval between the rising edge and the falling edge of the measurement target signal TRG.

In general, the i-th combined output value $DTS_i$ corresponds to a time interval between the i-th edge and the (i+1)-th edge of the measurement target signal TRG. Accordingly, the external device can calculate the frequency of the measurement target signal TRG based on the measurement data DO generated using the first to n-th combined output values $DTS_1$ to $DTS_n$, and measure the physical quantity detected by the physical quantity sensor 10.

Here, as shown in FIG. 14, in a period in which the first to n-th combined output values $DTS_1$ to $DTS_n$ are generated, the count data CNT increases by one each time the rising edge of the reference periodic signal CLK arrives without stopping the reference periodic signal CLK. Accordingly, a quantization error of the first combined output value $DTS_1$ is fed back to the generation of the second combined output value $DTS_2$. In general, a quantization error of the j-th combined output value $DTS_j$ is fed back to the generation of the (j+1)-th combined output value $DTS_{j+1}$. j is an integer of 1 or more and n−1 or less. That is, since the combined output data DTS including the first to n-th combined output values $DTS_1$ to $DTS_n$ satisfies the property of the delta-sigma modulation signal, the noise shaping effect is obtained, and the quantization error is shifted to the high-frequency band. Accordingly, the external device can measure the physical quantity with high accuracy based on the measurement data DO.

According to the sensor module 1 of the second embodiment described above, the same effects as those of the sensor module 1 of the first embodiment can be obtained.

3. Third Embodiment

Hereinafter, in the sensor module 1 according to a third embodiment, the same components as those in the first embodiment or the second embodiment are denoted by the same reference numerals, the description overlapping with the first embodiment or the second embodiment is omitted or simplified, and contents different from those in the first embodiment and the second embodiment will be mainly described.

Since a configuration of the sensor module 1 according to the third embodiment is the same as that in FIG. 1, the illustration and description thereof are omitted. However, in the third embodiment, the specific configuration of the time digital value generation unit 40 is different from those of the first embodiment and the second embodiment. Since the specific configurations of the count unit 30 and the combined output value generation unit 50 according to the third embodiment are the same as those in FIG. 3, the description thereof will be omitted.

Figures 15, 16:
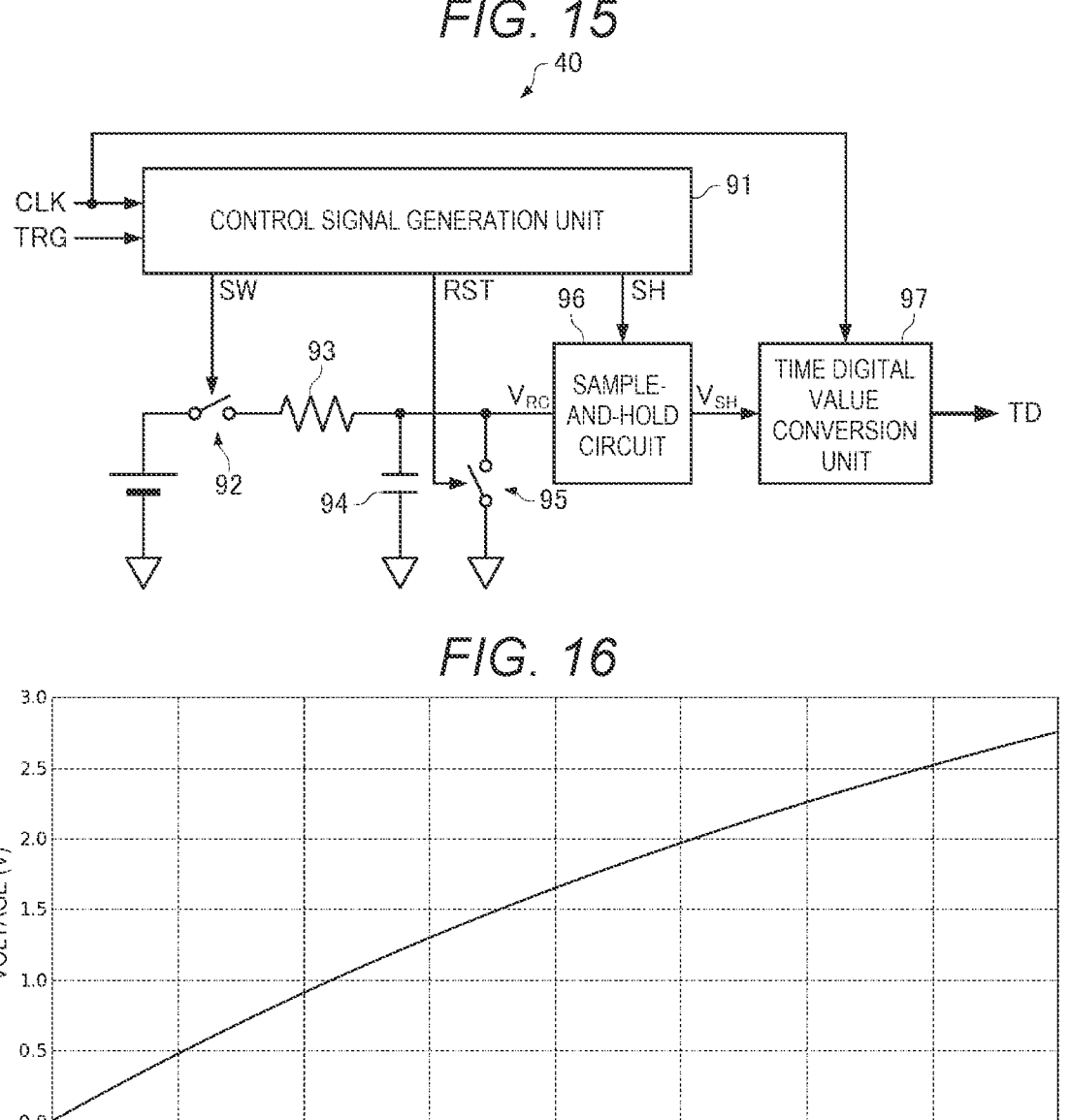

FIG. 15 is a diagram showing a configuration example of the time digital value generation unit 40 according to the third embodiment. As shown in FIG. 15, the time digital value generation unit 40 according to the third embodiment includes a control signal generation unit 91, a switch 92, a resistor 93, a capacitor 94, a switch 95, a sample-and-hold circuit 96, and a time digital value conversion unit 97.

The control signal generation unit 91 generates and outputs a switch control signal SW, a reset signal RST, and a sample-and-hold signal SH based on the reference periodic signal CLK and the measurement target signal TRG. Specifically, when the rising edge or the falling edge of the measurement target signal TRG arrives, the control signal generation unit 91 changes the switch control signal SW from a low level to a high level. When the rising edge of the reference periodic signal CLK arrives when the switch control signal SW is at the high level, the control signal generation unit 91 changes the switch control signal SW from the high level to the low level and changes the sample-and-hold signal SH from the low level to the high level. In a case where the rising edge of the reference periodic signal CLK arrives when the sample-and-hold signal SH is at the high level, the control signal generation unit 91 changes the sample-and-hold signal SH from the high level to the low level and changes the reset signal RST from the low level to the high level. In a case where the rising edge of the reference periodic signal CLK arrives when the reset signal RST is at the high level, the control signal generation unit 91 changes the reset signal RST from the high level to the low level.

The switch 92 has one end supplied with a power supply voltage and the other end coupled to one end of the resistor 93. The switch 92 is in a conductive state when the switch control signal SW is at the high level, and is in a non-conductive state when the switch control signal SW is at the low level.

The other end of the resistor 93 is coupled to one end of the capacitor 94, and the other end of the capacitor 94 is grounded. The resistor 93 and the capacitor 94 constitute an RC time constant circuit, and in a period in which the switch 92 is in the conductive state, the capacitor 94 is charged, and a voltage $V_{RC}$ of a coupling node between the resistor 93 and the capacitor 94 rises. FIG. 16 shows an example of a relationship between the voltage $V_{RC}$ and an elapsed time from when the switch 92 is turned on. The voltage $V_{RC}$ of the coupling node between the resistor 93 and the capacitor 94 is input to the sample-and-hold circuit 96.

One end of the switch 95 is coupled to the coupling node between the resistor 93 and the capacitor 94, and the other end of the switch 95 is grounded. The switch 95 is in a conductive state when the reset signal RST is at the high level, and is in a non-conductive state when the reset signal RST is at the low level. Accordingly, in a period in which the switch 95 is in the conductive state, the capacitor 94 is discharged, and the voltage $V_{RC}$ of the coupling node between the resistor 93 and the capacitor 94 decreases to a ground voltage.

The sample-and-hold circuit 96 samples and holds the voltage $V_{RC}$ based on the sample-and-hold signal SH. Specifically, the sample-and-hold circuit 96 samples the voltage $V_{RC}$ when the sample-and-hold signal SH changes from the low level to the high level, and holds the sampled voltage $V_{RC}$ as a voltage $V_{SH}$ during a period in which the sample-and-hold signal SH is at the high level.

The time digital value conversion unit 97 converts the voltage $V_{SH}$ held by the sample-and-hold circuit 96 into the time digital data TD and outputs the time digital data TD. Since the voltage $V_{SH}$ held by the sample-and-hold circuit 96 changes each time the rising edge and the falling edge of the measurement target signal TRG arrive, the time digital value conversion unit 97 converts each voltage $V_{SH}$ into the first to n-th time digital values $TD_1$ to $TD_n$ and outputs the time digital data TD including the time digital values $TD_1$ to $TD_n$. Specifically, the time digital value conversion unit 97 performs A/D conversion on the voltage $V_{SH}$ to digitalize the voltage $V_{SH}$, and calculates the i-th time digital value $TD_i$ corresponding to the digitalized voltage $V_{SH}$ based on table information or a formula corresponding to a voltage-time characteristic shown in FIG. 16. i is an integer of 1 or more and n or less. The time digital value $TD_i$ is a value corresponding to a time interval between the edge of the i-th measurement target signal TRG and the next rising edge of the reference periodic signal CLK.

The time digital value generation unit 40 configured as described above generates the first to n-th time digital values $TD_1$ to $TD_n$ by the time and voltage conversion method using the voltage $V_{RC}$ that changes according to a time difference between the edge of the measurement target signal TRG and the edge of the reference periodic signal CLK.

Figure 17:
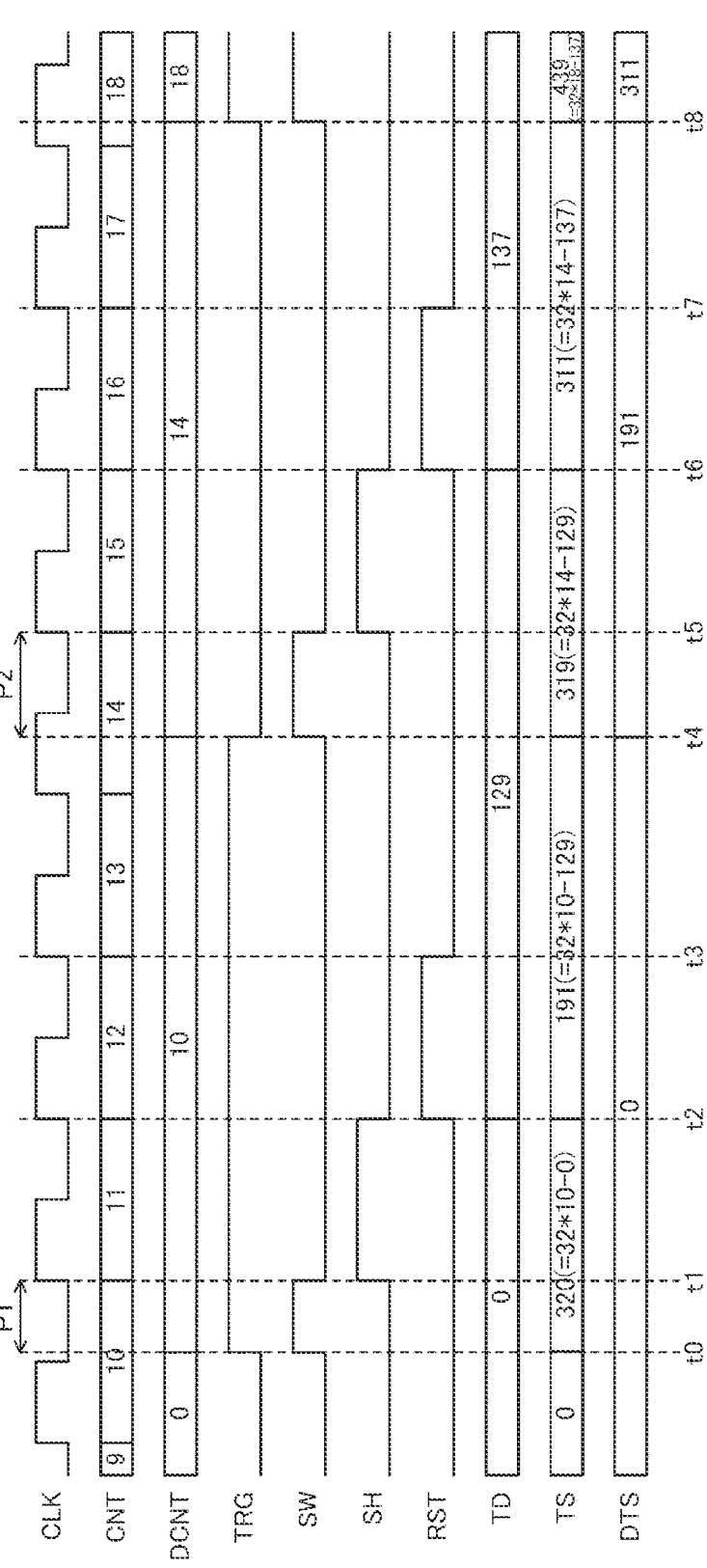
FIG. 17 is a timing chart showing an example of operations of a count unit, the time digital value generation unit, and a combined output value generation unit according to the third embodiment.

FIG. 17 is a timing chart showing an example of the operations of the count unit 30, the time digital value generation unit 40, and the combined output value generation unit 50. In the example of FIG. 17, the integer $N_p$ input to the multiplier 51 in the combined output value generation unit 50 is 32.

As shown in FIG. 17, the count data CNT increases by one each time the rising edge of the reference periodic signal CLK arrives. At a time point t0, when the measurement target signal TRG transitions from the low level to the high level, since the count data CNT at this time is 10, the count data DCNT changes from 0 to 10, and the time stamp data TS changes from 0 to 320. For example, the value 10 of the count data DCNT corresponds to the above-described first count value $DCNT_1$. When the measurement target signal TRG transitions from the low level to the high level, the switch control signal SW transitions from the low level to the high level.

At a time point t1 when a time P1 has elapsed from the time point t0, the first rising edge of the reference periodic signal CLK after the measurement target signal TRG has transitioned to the high level arrives, and the switch control signal SW transitions from the high level to the low level and the sample-and-hold signal SH transitions from the low level to the high level in synchronization with the edge.

At a time point t2, the next rising edge of the reference periodic signal CLK arrives, and the sample-and-hold signal SH transitions from the high level to the low level and the reset signal RST transitions from the low level to the high level in synchronization with the edge. In synchronization with the edge, the time digital data TD changes from 0 to 129, and the time stamp data TS changes from 320 to 191.

At a time point t3, the next rising edge of the reference periodic signal CLK arrives, and the reset signal RST transitions from the high level to the low level.

Thereafter, at a time point t4, when the measurement target signal TRG transitions from the high level to the low level, since the time stamp data TS at this time is 191, the combined output data DTS changes from 0 to 191. For example, the value 191 of the combined output data DTS corresponds to the above-described first combined output value $DTS_1$. Since the count data CNT is 14 when the measurement target signal TRG transitions from the high level to the low level, the count data DCNT changes from 10 to 14 and the time stamp data TS changes from 191 to 319. For example, the value 14 of the count data DCNT corresponds to the above-described second count value $DCNT_2$. When the measurement target signal TRG transitions from the high level to the low level, the switch control signal SW transitions from the low level to the high level.

At a time point t5 when a time P2 has elapsed from the time point t4, the first rising edge of the reference periodic signal CLK after the measurement target signal TRG has transitioned to the low level arrives, and the switch control signal SW transitions from the high level to the low level and the sample-and-hold signal SH transitions from the low level to the high level in synchronization with the edge.

At a time point t6, the next rising edge of the reference periodic signal CLK arrives, and the sample-and-hold signal SH transitions from the high level to the low level and the reset signal RST transitions from the low level to the high level in synchronization with the edge. In synchronization with the edge, the time digital data TD changes from 129 to 137, and the time stamp data TS changes from 319 to 311.

At a time point t7, the next rising edge of the reference periodic signal CLK arrives, and the reset signal RST transitions from the high level to the low level.

Thereafter, at a time point t8, when the measurement target signal TRG transitions from the low level to the high level, since the time stamp data TS at this time is 311, the combined output data DTS changes from 191 to 311. For example, the value 311 of the combined output data DTS corresponds to the above-described second combined output value $DTS_2$. Since the count data CNT is 18 when the measurement target signal TRG transitions from the low level to the high level, the count data DCNT changes from 14 to 18 and the time stamp data TS changes from 311 to 439. For example, the value 18 of the count data DCNT corresponds to the above-described third count value $DCNT_3$. When the measurement target signal TRG transitions from the low level to the high level, the switch control signal SW transitions from the low level to the high level.

Here, the time P2 from the time point t4 to the time point t5 is longer than the time P1 from the time point t0 to the time point t1. On the other hand, the longer the time interval between the edge of the measurement target signal TRG and the rising edge of the reference periodic signal CLK, the larger the value of the time digital data TD. The time digital data TD after the change at the time point t2, that is, 129, which is the first time digital value $TD_1$, corresponds to the time P1, and the time digital data TD after the change at the time point t6, that is, 137, which is the second time digital value $TD_2$, corresponds to the time P2.

In the example of FIG. 17, when a time of one cycle of the reference periodic signal CLK is set to T, a time during which the measurement target signal TRG is at the high level is $T \times (14-10) + P1 - P2 = (T \times 14 - P2) - (T \times 10 - P1)$. Here, the time stamp data TS after the change at the time point t2, that is, 191 ($=32 \times 10 - 129$) corresponds to $(T \times 10 - P1)$, and is the first combined output value $DTS_1$. The time stamp data TS after the change at the time point t6, that is, 311 ($=32 \times 14 - 137$) corresponds to $(T \times 14 - P2)$, and is the second combined output value $DTS_2$. Accordingly, a difference between the second combined output value $DTS_2$ and the first combined output value $DTS_1$, that is, 120 ($=311-191$) corresponds to a time during which the measurement target signal TRG is at the high level, that is, a time interval between the rising edge and the falling edge of the measurement target signal TRG.

In general, the i-th combined output value $DTS_i$ corresponds to a time interval between the i-th edge and the (i+1)-th edge of the measurement target signal TRG. Accordingly, the external device can calculate the frequency of the measurement target signal TRG based on the measurement data DO generated using the first to n-th combined output values $DTS_1$ to $DTS_n$, and measure the physical quantity detected by the physical quantity sensor 10.

Here, as shown in FIG. 17, in a period in which the first to n-th combined output values $DTS_1$ to $DTS_n$ are generated, the count data CNT increases by one each time the rising edge of the reference periodic signal CLK arrives without stopping the reference periodic signal CLK. Accordingly, a quantization error of the first combined output value $DTS_1$ is fed back to the generation of the second combined output value $DTS_2$. In general, a quantization error of the j-th combined output value $DTS_j$ is fed back to the generation of the (j+1)-th combined output value $DTS_{j+1}$. j is an integer of 1 or more and n-1 or less. That is, since the combined output data DTS including the first to n-th combined output values $DTS_1$ to $DTS_n$ satisfies the property of the delta-sigma modulation signal, the noise shaping effect is obtained, and the quantization error is shifted to the high-frequency band. Accordingly, the external device can measure the physical quantity with high accuracy based on the measurement data DO.

According to the sensor module 1 of the third embodiment described above, the same effects as those of the sensor module 1 of the first embodiment can be obtained.

4. Fourth Embodiment

Hereinafter, in the sensor module 1 according to a fourth embodiment, the same components as those in any one of the first embodiment to the third embodiment are denoted by the same reference numerals, the description overlapping with any one of the first embodiment to the third embodiment is omitted or simplified, and contents different from those in any one of the first embodiment to the third embodiment will be mainly described.

Figures 18, 19:
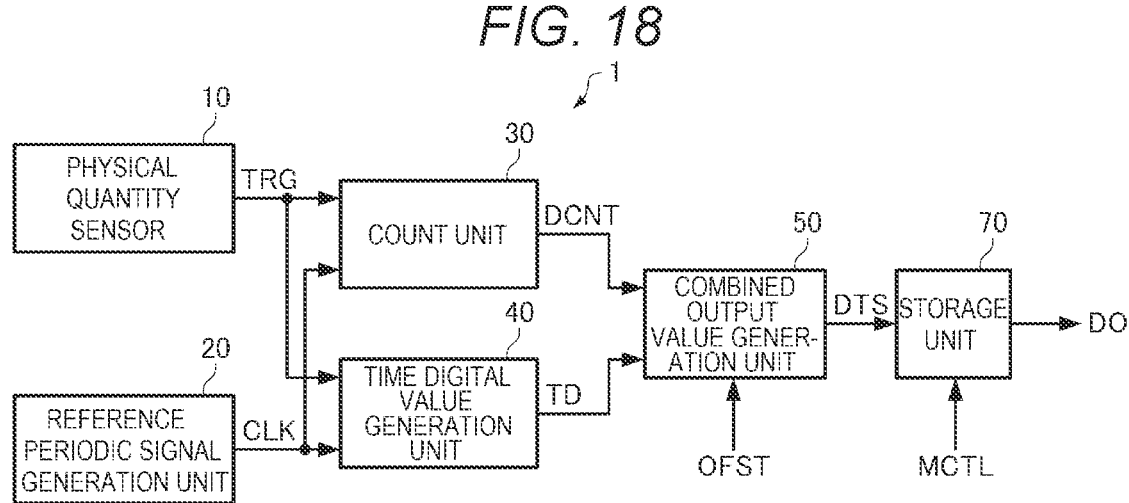
FIG. 18 is a block diagram showing a configuration of a sensor module according to a fourth embodiment.
FIG. 19 is a diagram showing an operation of a storage unit.

FIG. 18 is a block diagram showing a configuration of the sensor module 1 according to the fourth embodiment. As shown in FIG. 18, the sensor module 1 according to the fourth embodiment includes the physical quantity sensor 10, the reference periodic signal generation unit 20, the count unit 30, the time digital value generation unit 40, the combined output value generation unit 50, and a storage unit 70. Since functions of the physical quantity sensor 10, the reference periodic signal generation unit 20, the count unit 30, and the time digital value generation unit 40 are the same as those in any one of the first embodiment to the third embodiment, the description thereof will be omitted.

The combined output value generation unit 50 generates the i-th combined output value $DTS_i$ based on the i-th time digital value $TD_i$ included in the time digital data TD and the i-th count value $DCNT_i$ included in the count data DCNT, and outputs the combined output data DTS including the first to n-th combined output values $DTS_1$ to $DTS_n$. i is an integer of 1 or more and n or less. Specifically, the combined output value generation unit 50 subtracts an offset value OFST from a value obtained by combining the i-th time digital value $TD_i$ and the i-th count value $DCNT_i$ to generate the i-th combined output value $DTS_j$. The offset value OFST may be stored in advance in the storage unit 70 or another storage unit (not shown), or may be input to the sensor module 1 from the external device.

The storage unit 70 stores p continuous combined output values among the first to n-th combined output values $DTS_1$ to $DTS_n$ included in the combined output data DTS output from the combined output value generation unit 50, and the stored p combined output values are output based on a control signal MCTL. For example, when the storage unit 70 stores the (k+1)-th to (k+p)-th combined output values $DTS_{k+1}$ to $DTS_{k+p}$ as the p combined output values, storing of the (k+p+1)-th combined output value $DTS_{k+p+1}$ and the subsequent combined output values may be stopped and the (k+1)-th to (k+p)-th combined output values $DTS_{k+1}$ to $DTS_{k+p}$ may be output based on the control signal MCTL. The control signal MCTL may be input from the external device to the sensor module 1 or may be generated inside the sensor module 1. When the control signal MCTL is generated inside the sensor module 1, for example, the sensor module 1 may include a timer (not shown) and generate the control signal MCTL each time a predetermined time elapses in the timer.

The storage unit 70 may be a ring buffer. For example, the storage unit 70 is a RAM, and as shown in FIG. 19, a ring buffer may include p storage regions to which p addresses $A_1$ to $A_p$ are respectively allocated. The RAM is an abbreviation of a random access memory. For example, when the first to p-th combined output values $DTS_1$ to $DTS_p$ are sequentially written in the respective storage regions of the addresses $A_1$ to $A_p$, the storage unit 70 sequentially overwrites the (p+1)-th to 2p-th combined output values $DTS_{p+1}$ to $DTS_2p$ into the respective storage regions of the addresses $A_1$ to $A_p$.

Figure 20:
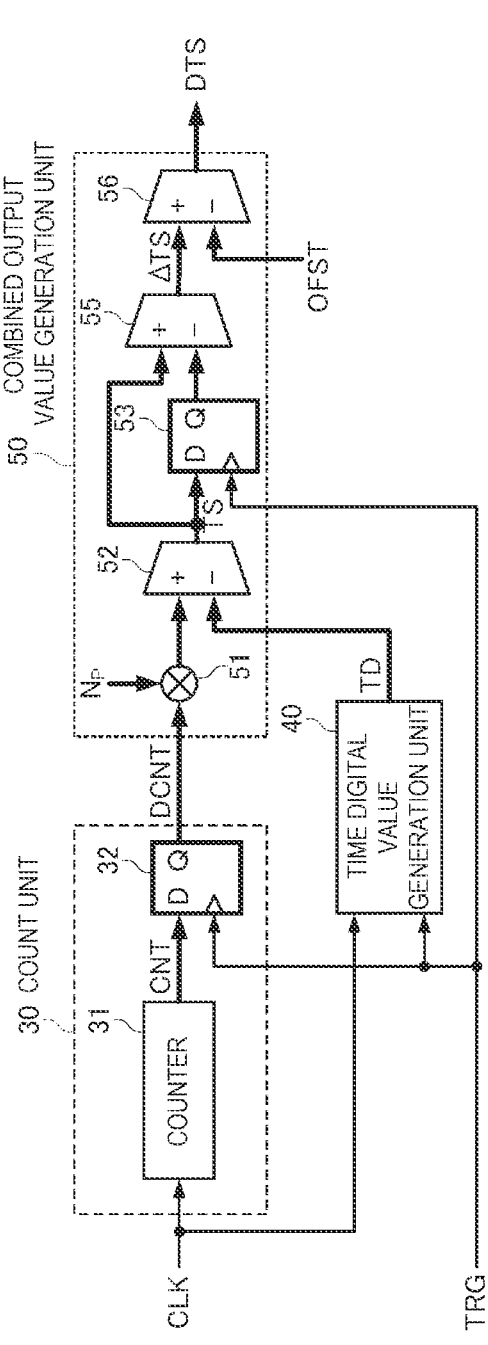
FIG. 20 is a diagram showing a configuration example of a count unit and a combined output value generation unit according to the fourth embodiment.

FIG. 20 is a diagram showing a configuration example of the count unit 30 and the combined output value generation unit 50 according to the fourth embodiment. As shown in FIG. 20, since the configuration of the count unit 30 is the same as that in FIG. 3, the description thereof will be omitted.

The combined output value generation unit 50 includes the multiplier 51, the subtractor 52, the N D-flip-flops 53, a subtractor 55, and a subtractor 56. That is, the combined output value generation unit 50 shown in FIG. 20 is different from the combined output value generation unit 50 shown in FIG. 3 in that the subtractor 55 and the subtractor 56 are added.

The subtractor 55 subtracts the N-bit data output from the N D-flip-flops 53 from the N-bit data output from the subtractor 52, and outputs N-bit time stamp difference data $\Delta$TS. The subtractor 56 subtracts the N-bit offset value OFST from N-bit data output from the subtractor 55, and outputs the N-bit combined output data DTS.

Each of the first to n-th combined output values $DTS_1$ to $DTS_n$ included in the combined output data DTS is a value based on a time stamp difference. Specifically, a time stamp difference value $\Delta TS_i$ included in the time stamp difference data $\Delta$TS is a difference value between an i-th time stamp value $TS_i$ and an (i−1)-th time stamp value $TS_{i-1}$ included in the time stamp data TS. i is an integer of 1 or more and n or less. However, a 0-th time stamp value $TS_0$ is a predetermined value determined in advance, for example, 0. Accordingly, the i-th combined output value $DTS_i$ included in the combined output data DTS is a value obtained by subtracting the offset value OFST from a difference value between an (i+1)-th time stamp value $TS_{i+1}$ and the i-th time stamp value $TS_i$, and is a value based on the time stamp difference.

Other configurations of the combined output value generation unit 50 are the same as those in FIG. 3, and description thereof is omitted.

In the sensor module 1 according to the fourth embodiment configured as described above, the external device can measure the frequency of the measurement target signal TRG by obtaining the (k+1)-th to (k+p)-th combined output values $DTS_{k+1}$ to $DTS_{k+p}$ stored in the storage unit 70. Specifically, first, the external device calculates a (k+i)-th time stamp difference value $\Delta TS_{k+i}$ for the (k+i)-th combined output value $DTS_{k+i}$ by Formula (1). i is an integer of 1 or more and p or less.

$$\Delta TS_{k+i} = DTS_{k+i} + QFST \tag{1}$$

Next, the external device calculates a (k+i)-th pulse number conversion value $\Delta P_{k+i}$ for the (k+i)-th time stamp difference value $\Delta TS_{k+i}$ by Formula (2). The (k+i)-th pulse number conversion value $\Delta P_{k+i}$ is the number of pulses of the reference periodic signal CLK present between the (k+i−1)-th edge and the (k+i)-th edge of the measurement target signal TRG. In Formula (2), $N_p$ is an integer input to the multiplier 51 of the combined output value generation unit 50.

$$P_{k+i} = \frac{\Delta TS_{k+i}}{N_P} \tag{2}$$

Finally, the external device calculates a (k+i)-th frequency $f_{k+i}$ for the (k+i)-th pulse number conversion value $\Delta P_{k+i}$ by Formula (3). The (k+i)-th frequency $f_{k+i}$ is the frequency of the measurement target signal TRG when a time interval between the (k+i−1)-th edge and the (k+i)-th edge of the measurement target signal TRG is a half cycle. In Formula (3), $f_{CLK}$ is the frequency of the reference periodic signal CLK.

$$f_{k+i} = \frac{f_{CLK}}{P_{k+i} \times 2} \tag{3}$$

According to the sensor module 1 of the fourth embodiment described above, the same effects as those of the first embodiment to the third embodiment can be obtained.

Further, in the sensor module 1 according to the fourth embodiment, since each of the first to n-th combined output values $DTS_1$ to $DTS_n$ is a value based on the time stamp difference, specifically, a value obtained by subtracting the offset value from the time stamp difference, absolute values of the first to n-th combined output values $DTS_1$ to $DTS_n$ decrease. According to the sensor module 1 of the fourth embodiment, the number of bits of the first to n-th combined output values $DTS_1$ to $DTS_n$ can be reduced, and a size of the storage unit 70 storing the p continuous combined output values and a communication amount with the external device can be reduced.

According to the sensor module 1 of the fourth embodiment, an upper limit of a frequency band in which the physical quantity can be measured in real time is limited by a communication rate with the external device. However, even when the frequency of the measurement target signal TRG is higher than the communication rate, the external device can offline obtain the p combined output values stored in the storage unit 70 and measure a signal component in a frequency band higher than the frequency band in which the physical quantity can be measured in real time.

According to the sensor module 1 of the fourth embodiment, the external device may offline obtain the p combined output values stored in the storage unit 70, and thus can communicate with the external device using a general protocol such as SPI, I2C, or UART. SPI is an abbreviation of serial peripheral interface, I2C is an abbreviation of inter integrated circuit, and UART is an abbreviation of universal asynchronous receiver transmitter. Accordingly, for example, in an inspection process of the sensor module 1, it is not necessary to incorporate dedicated software for reading combined output values into an inspection device, and an inspection system can be easily constructed.

According to the sensor module 1 of the fourth embodiment, the storage unit 70 is a ring buffer, and can more easily store the latest p combined output values using a capacity of the storage unit 70 as the maximum limit by overwriting the oldest combined output value each time a combined output value is generated.

According to the sensor module 1 of the fourth embodiment, since the storage unit 70 stops storing the combined output value based on the control signal MCTL, the external device can quickly obtain the p combined output values from the storage unit 70 at a predetermined timing based on the control signal MCTL.

5. Fifth Embodiment

Hereinafter, in the sensor module 1 according to a fifth embodiment, the same components as those in any one of the first embodiment to the fourth embodiment are denoted by the same reference numerals, the description overlapping with any one of the first embodiment to the fourth embodiment is omitted or simplified, and contents different from those in any one of the first embodiment to the fourth embodiment will be mainly described.

Figures 21, 22:
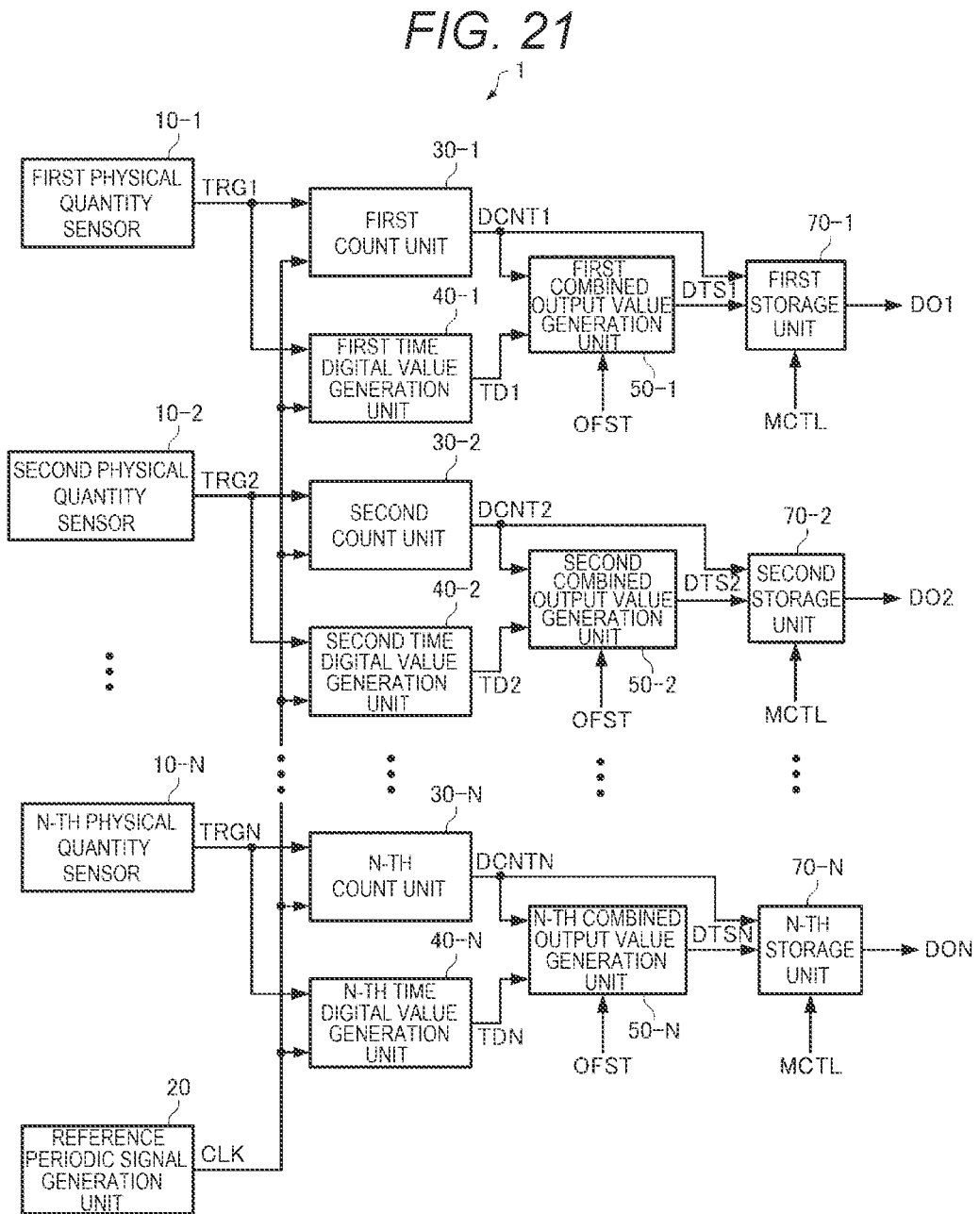
FIG. 21 is a block diagram showing a configuration of a sensor module according to a fifth embodiment.
FIG. 22 is a diagram showing an operation of an m-th storage unit.

FIG. 21 is a block diagram showing a configuration of the sensor module 1 according to the fifth embodiment. As shown in FIG. 21, the sensor module 1 according to the fifth embodiment includes first to N-th physical quantity sensors 10-1 to 10-N, the reference periodic signal generation unit 20, first to N-th count units 30-1 to 30-N, first to N-th time digital value generation units 40-1 to 40-N, first to N-th combined output value generation units 50-1 to 50-N, and first to N-th storage units 70-1 to 70-N. N is an integer of 2 or more.

As in the first embodiment to the fourth embodiment, the reference periodic signal generation unit 20 outputs the reference periodic signal CLK.

For example, the first to N-th physical quantity sensors 10-1 to 10-N may be attached to N portions of the measurement target object, or a part of the first to N-th physical quantity sensors 10-1 to 10-N may be attached to a first measurement target object and the other part may be attached to a second measurement target object different from the first measurement target object.

The m-th physical quantity sensor 10-m outputs an m-th measurement target signal TRGm whose frequency changes according to a magnitude of a detected predetermined m-th physical quantity. m is an integer of 1 or more and N or less. Specifically, the m-th physical quantity sensor 10-m includes a physical quantity detection element (not shown) that detects the m-th physical quantity and an oscillation circuit (not shown) that oscillates the physical quantity detection element. The oscillation circuit outputs the m-th measurement target signal TRGm. For example, the first to N-th physical quantities may be an acceleration, an angular velocity, an angular acceleration, a pressure, a mass, a voltage, a magnetic force, a static capacitance, a temperature, or the like. All of the physical quantities may be the same type of physical quantities. A part of the physical quantities may be different types of physical quantities.

The m-th count unit 30-m counts a time event of one of the m-th measurement target signal TRGm and the reference periodic signal CLK in synchronization with the other to generate the first to n-th count values $DCNT_1$ to $DCNT_n$ in time series, and outputs m-th count data DCNTm including the first to n-th count values $DCNT_1$ to $DCNT_n$. m is an integer of 1 or more and N or less. n is an integer of 2 or more. The time event of the m-th measurement target signal TRGm is a timing at which the m-th measurement target signal TRGm changes, and may be, for example, a rising edge or a falling edge of the m-th measurement target signal TRGm, or the rising edge and the falling edge of the m-th measurement target signal TRGm. Similarly, the time event of the reference periodic signal CLK is a timing at which the reference periodic signal CLK changes, and may be, for example, a rising edge or a falling edge of the reference periodic signal CLK, or the rising edge and the falling edge of the reference periodic signal CLK.

The m-th time digital value generation unit 40-m generates the first to n-th time digital values $TD_1$ to $TD_n$ based on a phase difference between the m-th measurement target signal TRGm and the reference periodic signal CLK in time series, and outputs m-th time digital data TDm including the first to n-th time digital values $TD_1$ to $TD_n$. m is an integer of 1 or more and N or less.

The m-th combined output value generation unit 50-m generates the i-th combined output value $DTS_i$ based on the i-th time digital value $TD_i$ generated by the m-th time digital value generation unit 40-m and the i-th count value $DCNT_i$ generated by the m-th count unit 30-m, and outputs m-th combined output data DTSm including the first to n-th combined output values $DTS_1$ to $DTS_n$. m is an integer of 1 or more and N or less. i is an integer of 1 or more and n or less. For example, the m-th combined output value generation unit 50-m may generate the first to n-th combined output values $DTS_1$ to $DTS_n$ in synchronization with the m-th measurement target signal TRGm.

The m-th combined output value generation unit 50-m may generate the first to n-th combined output values $DTS_1$ to $DTS_n$ in time series at one of rising and falling timings of the m-th measurement target signal TRGm. Alternatively, the m-th combined output value generation unit 50-m may generate the first to n-th combined output values $DTS_1$ to $DTS_n$ in time series at both the rising and the falling timings of the m-th measurement target signal TRGm.

The m-th combined output data DTSm including the first to n-th combined output values $DTS_1$ to $DTS_n$ is a signal indicating a frequency ratio between the reference periodic signal CLK and the m-th measurement target signal TRGm output from the m-th physical quantity sensor 10-m.

Also in the fifth embodiment, similarly to the first embodiment to the fourth embodiment, in the m-th combined output value generation unit 50-m, in a period in which the first to n-th combined output values $DTS_1$ to $DTS_n$ are generated, the count data CNT increases by one each time the rising edge of the reference periodic signal CLK arrives without stopping the reference periodic signal CLK. Accordingly, the quantization error of the j-th combined output value $DTS_j$ generated by the m-th combined output value generation unit 50-m is fed back to the generation of the (j+1)-th combined output value $DTS_{j+1}$. j is an integer of 1 or more and n−1 or less. That is, since the m-th combined output data DTSm including the first to n-th combined output values $DTS_1$ to $DTS_n$ generated by the m-th combined output value generation unit 50-m satisfies the property of the delta-sigma modulation signal, the noise shaping effect is obtained, and the quantization error is shifted to the high-frequency band.

In the fifth embodiment, as in the first embodiment to the fourth embodiment, the period $T_{min}=1/f_{max}$ of the change in the m-th physical quantity when the frequency, at which the m-th physical quantity changes, is the maximum frequency $f_{max}$ in the frequency band F which is defined by the specification and in which the physical quantity is detectable, is also longer than eight times the average period $T_{avg}$ in which the first to n-th combined output values $DTS_1$ to $DTS_n$ are generated by the m-th combined output value generation unit 50-m.

The m-th storage unit 70-m stores p continuous combined output values among the first to n-th combined output values $DTS_1$ to $DTS_n$ generated by the m-th combined output value generation unit 50-m, and the stored p combined output values are output based on the control signal MCTL. m is an integer of 1 or more and N or less. For example, when the m-th storage unit 70-m stores the (k+1)-th to (k+p)-th combined output values $DTS_{k+1}$ to $DTS_{k+p}$ as the p combined output values, storing of the (k+p+1)-th combined output value $DTS_{k+p+1}$ and the subsequent combined output values may be stopped and the (k+1)-th to (k+p)-th combined output values $DTS_{k+1}$ to $DTS_{k+p}$ may be output based on the control signal MCTL. The control signal MCTL may be input from the external device to the sensor module 1 or may be generated inside the sensor module 1. When the control signal MCTL is generated inside the sensor module 1, for example, the sensor module 1 may include a timer (not shown) and generate the control signal MCTL each time a predetermined time elapses in the timer.

When the (k+1)-th to (k+p)-th combined output values $DTS_{k+1}$ to $DTS_{k+p}$ are stored as the p combined output values, the m-th storage unit 70-m may further store any one of the (k+1)-th to (k+p)-th count values $DCNT_{k+1}$ to $DCNT_{k+p}$. The m-th storage unit 70-m may output any one of the (k+1)-th to (k+p)-th combined output values $DTS_{k+1}$ to $DTS_{k+p}$ and the (k+1)-th to (k+p)-th count values $DCNT_{k+1}$ to $DCNT_{k+p}$ based on the control signal MCTL. For example, when the (k+1)-th to (k+p)-th combined output values $DTS_{k+1}$ to $DTS_{k+p}$ are stored as the p combined output values, the m-th storage unit 70-*m* may further store the (k+p)-th count value $DCNT_{k+p}$ and output the (k+1)-th to (k+p)-th combined output values $DTS_{k+1}$ to $DTS_{k+p}$ and the (k+p)-th count value $DCNT_{k+p}$ based on the control signal MCTL.

The m-th storage unit 70-*m* may be a ring buffer. For example, the m-th storage unit 70-*m* is a RAM, and as shown in FIG. 22, a ring buffer includes p+1 storage regions to which p+1 addresses $A_1$ to $A_{p+1}$ are respectively allocated. For example, when j is an integer of 0 or more and i is an integer of 1 or more and p or less, and each integer q=j×p+i, the m-th storage unit 70-*m* writes the q-th combined output value $DTS_q$ to the storage region of the address $A_i$ and writes the q-th count value $DCNT_q$ generated by the m-th count unit 30-*m* to the storage region of the address $A_{p+1}$ each time the m-th combined output value generation unit 50-*m* generates the q-th combined output value $DTS_q$. For example, when the m-th storage unit 70-*m* sequentially writes the first to p-th combined output values $DTS_1$ to $DTS_p$ in the storage regions of the addresses $A_1$ to $A_p$ and sequentially writes the first to p-th count values $DCNT_1$ to $DCNT_p$ in the storage region of the address $A_{p+1}$, the m-th storage unit 70-*m* sequentially overwrites the (p+1)-th to 2p-th combined output values $DTS_{p+1}$ to $DTS_2p$ in the storage regions of the addresses $A_1$ to $A_p$ and sequentially overwrites the (p+1)-th to 2p-th count values $DCNT_{p+1}$ to $DCNT_2p$ in the storage region of the address $A_{p+1}$.

The specific configurations of the m-th count unit 30-*m*, the m-th time digital value generation unit 40-*m*, and the m-th combined output value generation unit 50-*m* are the same as those of the count unit 30, the time digital value generation unit 40, and the combined output value generation unit 50 in any one of the first embodiment to the fourth embodiment, and thus the illustration and the description thereof are omitted.

In the sensor module 1 according to the fifth embodiment configured as described above, the external device can obtain the (k+1)-th to (k+p)-th combined output values $DTS_{k+1}$ to $DTS_{k+p}$ stored in the m-th storage unit 70-*m*, and calculate the frequency of the m-th measurement target signal TRGm by Formula (1) to Formula (3). m is an integer of 1 or more and N or less. However, since the first to N-th measurement target signals TRG1 to TRGN are not synchronized, phase differences of the first to N-th measurement target signals TRG1 to TRGN are unknown since only the frequencies are calculated. Therefore, the external device calculates the (k+1)-th to (k+p)-th time stamp difference values $\Delta TS_{k+1}$ to $\Delta TS_{k+p}$ by Formula (1) for the (k+1)-th to (k+p)-th combined output values $DTS_{k+1}$ to $DTS_{k+p}$ stored in the m-th storage unit 70-*m* and integrates the (k+1)-th to (k+p)-th time stamp difference values $\Delta TS_{k+1}$ to $\Delta TS_{k+p}$. m is an integer of 1 or more and N or less. Therefore, the external device calculates the (k+1)-th to (k+p)-th time stamp values $TS_{k+1}$ to $TS_{k+p}$ and corrects the (k+1)-th to (k+p)-th time stamp values $TS_{k+1}$ to $TS_{k+p}$ using the N count values stored in the first to N-th storage units 70-1 to 70-N.

For example, the sensor module 1 is a three-axis sensor module including the first physical quantity sensor 10-1 having a detection axis as an x-axis, the second physical quantity sensor 10-2 having a detection axis as a y-axis, and the third physical quantity sensor 10-3 having a detection axis as a z-axis. The first storage unit 70-1 stores p combined output values $DTSx_{k+1}$ to $DTSx_{k+p}$ and a count value $DCNTx_{k+p}$. The second storage unit 70-2 stores p combined output values $DTSy_{k+1}$ to $DTSy_{k+p}$ and a count value $DCNTy_{k+p}$. The third storage unit 70-3 stores p combined output values $DTSz_{k+1}$ to $DTSz_{k+p}$ and a count value $DCNTz_{k+p}$. In this case, first, the external device calculates p time stamp difference values $\Delta TSx_k+1$ to $\Delta TSx_{k+p}$ for the p combined output values $DTSx_{k+1}$ to $DTSx_{k+p}$ by the same formula as Formula (1). Similarly, the external device calculates p time stamp difference values $\Delta TSy_{k+1}$ to $\Delta TSy_{k+p}$ for the p combined output values $DTSy_{k+1}$ to $DTSy_{k+p}$ by the same formula as Formula (1). Similarly, the external device calculates p time stamp difference values $\Delta TSZ_{k+1}$ to $\Delta TSz_{k+p}$ for the p combined output values $DTSZ_{k+1}$ to $DTSz_{k+p}$ by the same formula as Formula (1).

Next, the external device calculates the time stamp value $TSx_{k+i}$ for the time stamp difference value $\Delta TSx_{k+i}$ by Formula (4). i is an integer of 1 or more and p or less.

$$TSx_{k+i} = \sum_{j=1}^{i} \Delta TSx_{k+i} \tag{4}$$

Similarly, the external device calculates the time stamp value $TSy_{k+i}$ for the time stamp difference value $\Delta TSy_{k+i}$ by Formula (5).

$$TSy_{k+i} = \sum_{j=1}^{i} \Delta TSy_{k+i} \tag{5}$$

Similarly, the external device calculates the time stamp value $TSZ_{k+i}$ for the time stamp difference value $\Delta TSZ_{k+i}$ by Formula (6).

$$TSz_{k+i} = \sum_{j=1}^{i} \Delta TSz_{k+i} \tag{6}$$

Next, the external device calculates a time stamp correction value $TSx'_{k+i}$ for the time stamp value $TSx_{k+i}$ by Formula (7).

$$TSx'_{k+i} = TSx_{k+i} \tag{7}$$

The external device calculates a time stamp correction value $TSy'_{k+i}$ for the time stamp value $TSy_{k+i}$ by Formula (8).

$$TSy'_{k+i} = TSy_{k+i} + (TSy_{k+p} - TSx_{k+p}) + (DCNTy_{k+p} - DCNTx_{k+p}) \tag{8}$$

Finally, the external device calculates a time stamp correction value $TSz'_{k+i}$ for the time stamp value $TSz_{k+i}$ by Formula (9).

$$TSz'_{k+i} = TSz_{k+i} + (TSz_{k+p} - TSx_{k+p}) + (DCNTz_{k+p} - DCNTx_{k+p}) \tag{9}$$

For example, the first storage unit 70-1 stores seven combined output values $DTSx_{k+1}$ to $DTSx_{k+7}$ and a count value $DCNTx_{k+7}$. The second storage unit 70-2 stores seven combined output values $DTSy_{k+1}$ to $DTSy_{k+7}$ and a count value $DCNTy_{k+7}$. The third storage unit 70-3 stores seven combined output values $DTSz_{k+1}$ to $DTSz_{k+7}$ and a count value $DCNTz_{k+7}$. These values are shown in FIG. 23. In this case, FIG. 24 is obtained by plotting seven time stamp values $TSx_{k+1}$ to $TSx_{k+7}$ calculated by Formula (4), seven time stamp values $TSy_{k+1}$ to $TSy_{k+7}$ calculated by Formula (5), and seven time stamp values $TSz_{k+1}$ to $TSz_{k+7}$ calculated by Formula (6). FIG. 24 also illustrates measurement target signals TRGx, TRGy, and TRGz corresponding to the first to third measurement target signals TRG1 to TRG3. As shown in FIG. 24, each of the time stamp values $TSx_{k+1}$ to $TSx_{k+7}$ indicates a timing of an edge of the measurement target signal TRGx, each of the time stamp values $TSy_{k+1}$ to $TSy_{k+7}$ indicates a timing of an edge of the measurement target signal TRGy, and each of the time stamp values $TSz_{k+1}$ to $TSz_{k+7}$ indicates a timing of an edge of the measurement target signal TRGz. In the time stamp values $TSx_{k+1}$ to $TSx_{k+7}$, $TSy_{k+1}$ to $TSy_{k+7}$, and $TSz_{k+1}$ to $TSz_{k+7}$, information on phase differences of the measurement target signals TRGx, TRGy, and TRGz is missing, and thus, as shown in FIG. 24, initial phases of the measurement target signals TRGx, TRGy, and TRGz are the same.

On the other hand, FIG. 25 is obtained by plotting seven time stamp correction values $TSx'_{k+1}$ to $TSx'_{k+7}$ calculated by Formula (7), seven time stamp correction values $TSy'_{k+1}$ to $TSy'_{k+7}$ calculated by Formula (8), and seven time stamp correction values $TSz'_{k+1}$ to $TSz'_{k}+y$ calculated by Formula (9). Since the time stamp correction values $TSx'_{k+1}$ to $TSx'_{k+7}$, $TSy'_{k+1}$ to $TSy'_{k+7}$, and $TSz'_{k+1}$ to $TSz'_{k+7}$ include the information on the phase differences of the measurement target signals TRGx, TRGy, and TRGz based on the count values $DCNTx_{k+7}$, $DCNTy_{k+7}$, and $DCNTz_{k+7}$, as shown in FIG. 25, the timing of each edge of each of the measurement target signals TRGx, TRGy, and TRGz is accurately reproduced.

Next, a three-axis acceleration sensor module is taken as an example of the sensor module 1 according to the fifth embodiment, and a structure of the sensor module 1 will be described with reference to FIGS. 26 to 29.

Figure 26:
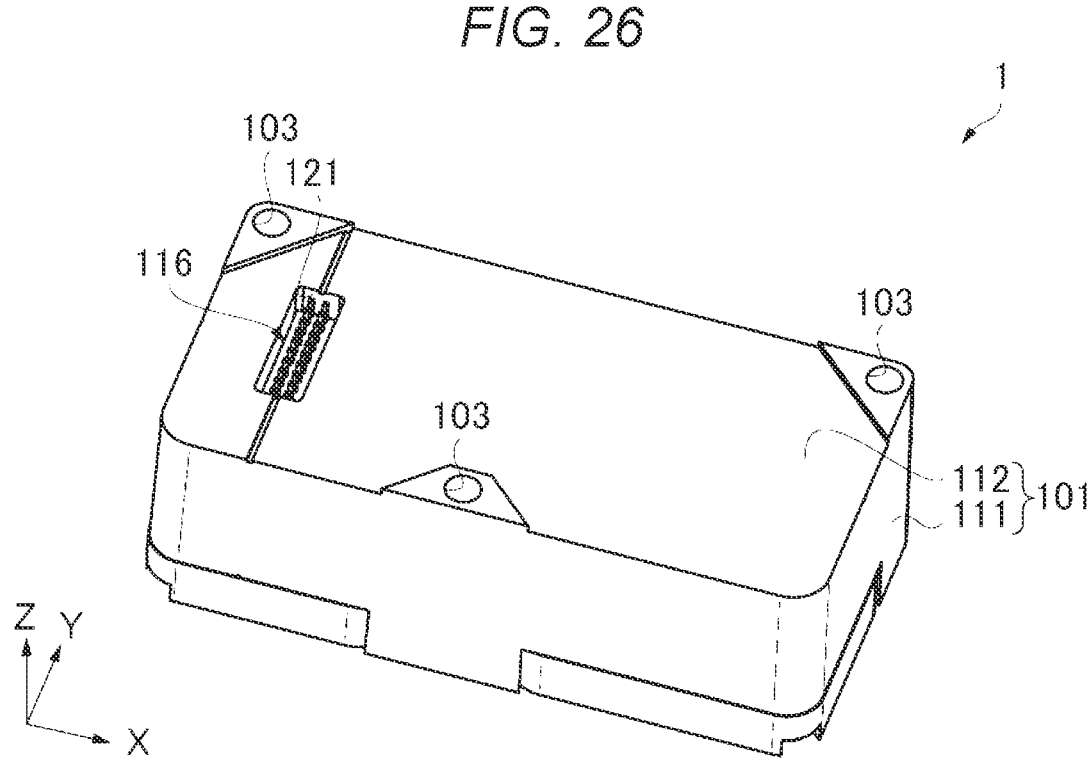
FIG. 26 is a perspective view of the sensor module.

FIG. 26 is a perspective view showing a configuration of the sensor module 1 when viewed from a mounted surface side to which the sensor module 1 is fixed. In the following description, a direction along a long side of the sensor module 1 having a rectangular shape in a plan view is referred to as an X-axis direction, a direction orthogonal to the X-axis direction in a plan view is referred to as a Y-axis direction, and a thickness direction of the sensor module 1 is referred to as a Z-axis direction.

The sensor module 1 is a rectangular parallelepiped having a rectangular planar shape, and has, for example, a size in which a length of the long side along the X-axis direction is about 50 mm, a length of a short side along the Y-axis direction orthogonal to the X-axis direction is about 24 mm, and a thickness is about 16 mm. Screw holes 103 are formed at two locations in the vicinity of end portions of one long side and at one location in a center portion of the other long side. Each of the three screw holes 103 is used in a state of being fixed to a mounted surface of a mounted body of a structure such as a bridge or a bulletin board through a fixing screw.

As shown in FIG. 26, an opening portion 121 is provided on a surface of the sensor module 1 as viewed from the mounted surface side. A plug type connector 116 is disposed inside the opening portion 121. The connector 116 has a plurality of pins arranged in two rows, and the plurality of pins are arranged along the Y-axis direction in each row. A socket type connector (not shown) from the mounted body is coupled to the connector 116, and transmission and reception of electric signals such as a drive voltage and detection data of the sensor module 1 are performed.

Figure 27:
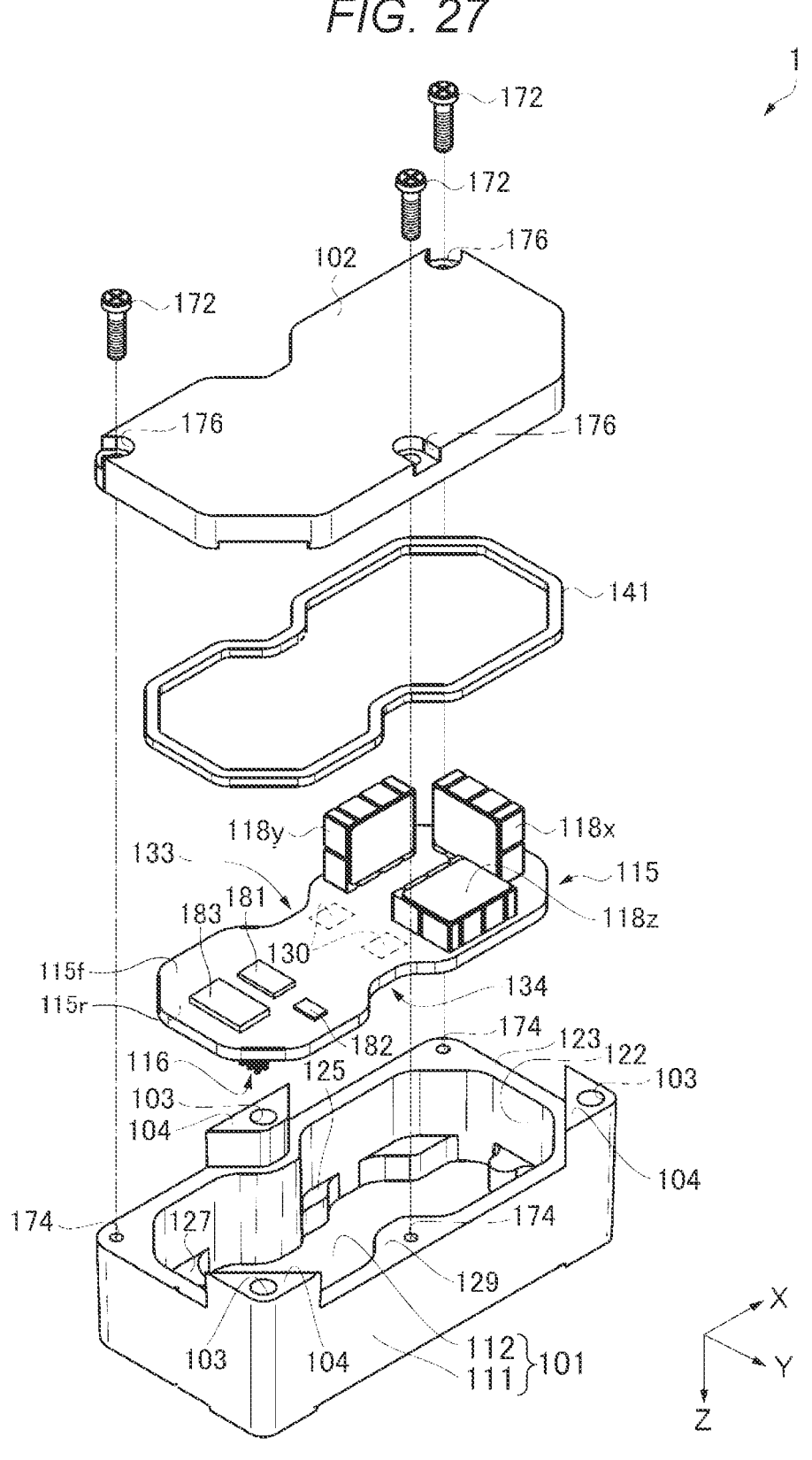
FIG. 27 is an exploded perspective view of the sensor module.

FIG. 27 is an exploded perspective view of the sensor module 1. As shown in FIG. 27, the sensor module 1 includes a container 101, a lid portion 102, a seal member 141, a circuit board 115, or the like. More specifically, the sensor module 1 has a configuration in which the circuit board 115 is attached to the inside of the container 101 with fixing members 130 interposed therebetween, and an opening of the container 101 is covered with the lid portion 102 with the seal member 141 having a cushioning property interposed therebetween.

The container 101 is a container housing the circuit board 115 made of, for example, aluminum and formed in a box shape having an internal space. The container 101 can be formed by cutting out aluminum or by die casting. A material of the container 101 is not limited to aluminum, and other metals such as zinc and stainless steel, a resin, a composite material of a metal and a resin, or the like may be used. Similar to the overall shape of the sensor module 1 described above, an outer shape of the container 101 is a rectangular parallelepiped having a substantially rectangular planar shape. Fixing protrusion portions 104 are provided at two locations in the vicinity of both end portions of one long side and at one location in a center portion of the other long side. The screw holes 103 are respectively formed in the fixing protrusion portions 104. Here, the fixing protrusion portions 104 provided at the two locations in the vicinity of both end portions of one long side each include an intersection portion of the short side and the long side, and have a substantially triangular shape in a plan view. In addition, the fixing protrusion portion 104 provided at the one location in the center portion of the other long side has a substantially trapezoidal shape facing an internal space side of the container 101 in a plan view.

The container 101 has a rectangular parallelepiped outer shape and a box shape that is open on one side. The inside of the container 101 is an internal space surrounded by a bottom wall 112 and a side wall 111. In other words, the container 101 has a box shape in which one surface facing the bottom wall 112 is an opening surface 123, an outer edge of the circuit board 115 is disposed along an inner surface 122 of the side wall 111, and the lid portion 102 is fixed so as to cover the opening. Here, the opening surface 123 facing the bottom wall 112 is a surface on which the lid portion 102 is placed. On the opening surface 123, the fixing protrusion portions 104 are erected at two locations in the vicinity of both end portions of the one long side of the container 101 and at one location at the center portion of the other long side. Then, an upper surface of the fixing protrusion portion 104, that is, a surface exposed in a −Z direction is flush with the upper surface of the container 101.

In the internal space of the container 101, a protrusion portion 129, which protrudes from the side wall 111 to the internal space side, is provided from the bottom wall 112 to the opening surface 123. The protrusion portion 129 is a center portion of one long side facing the fixing protrusion portion 104 provided at the center portion of the other long side. A female thread 174 is provided in an upper surface of the protrusion portion 129. The lid portion 102 is fixed to the container 101 via the seal member 141 by female threads 174 and screws 172 inserted into through holes 176. Here, the fixing protrusion portion 104 provided at the center portion of the other long side may protrude from the side wall 111 to the internal space side and from the bottom wall 112 to the opening surface 123, similar to the protrusion portion 129. The protrusion portion 129 and the fixing protrusion portion 104 are provided at positions facing constricted portions 133 and 134 of the circuit board 115, which will be described later.

In the internal space of the container 101, a first pedestal 127 and a second pedestal 125 protruding in step shapes, each of which is one step higher, from the bottom wall 112 toward the opening surface 123 are provided. The first pedestal 127 is provided at a position facing an arrangement region of the plug type connector 116 attached to the circuit board 115, and as shown in FIG. 26, the opening portion 121 into which the plug type connector 116 is inserted is provided. The first pedestal 127 functions as a pedestal for fixing the circuit board 115 to the container 101. The opening portion 121 penetrates the inside and the outside of the container 101.

The second pedestal 125 is located on an opposite side of the fixing protrusion portion 104 located at the center portion of the long side and the protrusion portion 129 from the first pedestal 127, and is provided in the vicinity of the fixing protrusion portion 104 and the protrusion portion 129. The second pedestal 125 may be coupled to either the fixing protrusion portion 104 or the protrusion portion 129. The second pedestal 125 functions as a pedestal for fixing the circuit board 115 to the container 101 on the opposite side of the fixing protrusion portion 104 and the protrusion portion 129 from the first pedestal 127.

Although the outer shape of the container 101 is described as a rectangular parallelepiped having a substantially rectangular planar shape and a box shape without a lid, the planar shape of the outer shape of the container 101 is not limited thereto, and may be square, hexagonal, octagonal, or the like. In the planar shape of the outer shape of the container 101, corners of vertex portions of the polygon may be chamfered, and any one side may be a curved planar shape. The planar shape of the inside of the container 101 is not limited to the above-described shape, and may be another shape. Further, the planar shapes of the outer shape and the inner shape of the container 101 may be similar to each other or may not be similar to each other.

The circuit board 115 is a multilayer board in which a plurality of through holes or the like are formed, and a glass epoxy board is used as the circuit board 115. The circuit board 115 is not limited to the glass epoxy board, may be a rigid board on which a plurality of physical quantity sensors, electronic components, connectors, or the like can be mounted, and may be, for example, a composite board or a ceramic board.

The circuit board 115 has a second surface 115r on the bottom wall 112 side and a first surface 115f which has a front and back relationship with the second surface 115r. ICs 181 and 182, an FPGA 183, and acceleration sensors 118x, 118y, and 118z are mounted on the first surface 115f of the circuit board 115. FPGA is an abbreviation of field programmable gate array, and IC is an abbreviation of integrated circuit. The acceleration sensor 118x includes a sensor element provided in the first physical quantity sensor 10-1. The acceleration sensor 118y includes a sensor element provided in the second physical quantity sensor 10-2. The acceleration sensor 118z includes a sensor element provided in the third physical quantity sensor 10-3. The IC 181 includes three oscillation circuits that oscillate the acceleration sensors 118x, 118y, and 118z. The IC 182 includes reference periodic signal generation unit 20. The FPGA 183 includes the first count unit 30-1, the first time digital value generation unit 40-1, the first combined output value generation unit 50-1, and the first storage unit 70-1. The FPGA 183 includes the second count unit 30-2, the second time digital value generation unit 40-2, the second combined output value generation unit 50-2, and the second storage unit 70-2. The FPGA 183 includes the third count unit 30-3, the third time digital value generation unit 40-3, the third combined output value generation unit 50-3, and the third storage unit 70-3.

The connector 116 is mounted on the second surface 115r of the circuit board 115. Although illustration and description thereof are omitted, other interconnects, terminal electrodes, or the like may be provided on the circuit board 115.

The circuit board 115 includes the constricted portions 133 and 134 at which the outer edge of the circuit board 115 is constricted at the center portions in the X-axis direction along the long sides of the container 101 in a plan view. The constricted portions 133 and 134 are provided on both sides of the circuit board 115 in the Y-axis direction in the plan view, and constricted from the outer edge toward the center of the circuit board 115. The constricted portions 133 and 134 face the protrusion portion 129 and the fixing protrusion portion 104 of the container 101.

The circuit board 115 is inserted into the internal space of the container 101 with the second surface 115r facing the first pedestal 127 and the second pedestal 125. The circuit board 115 is supported by the container 101 by the first pedestal 127 and the second pedestal 125.

Each of the acceleration sensors 118x, 118y, and 118z detects an acceleration in one axial direction. Specifically, the acceleration sensor 118x is erected such that front and back surfaces of a package thereof face the X-axis direction and the side surface faces the first surface 115f of the circuit board 115. The acceleration sensor 118x detects the acceleration applied in the X-axis direction. The acceleration sensor 118y is erected such that the front and back surfaces of a package thereof face the Y-axis direction and the side surface faces the first surface 115f of the circuit board 115. The acceleration sensor 118y detects the acceleration applied in the Y-axis direction. The acceleration sensor 118z is provided such that the front and back surfaces of a package thereof face the Z-axis direction, that is, the front and back surfaces of the package face the first surface 115f of the circuit board 115. The acceleration sensor 118z detects the acceleration applied in the Z-axis direction.

The IC 181 is electrically coupled to the acceleration sensors 118x, 118y, and 118z via interconnects (not shown). The IC 182 is electrically coupled to the IC 181 via an interconnect (not shown). The FPGA 183 is electrically coupled to the IC 182 via an interconnect (not shown). Although not shown, a plurality of other electronic components or the like may be mounted on the circuit board 115.

Here, configurations of the acceleration sensors 118x, 118y, and 118z will be described with reference to FIGS. 28 and 29.

Figures 28, 29:
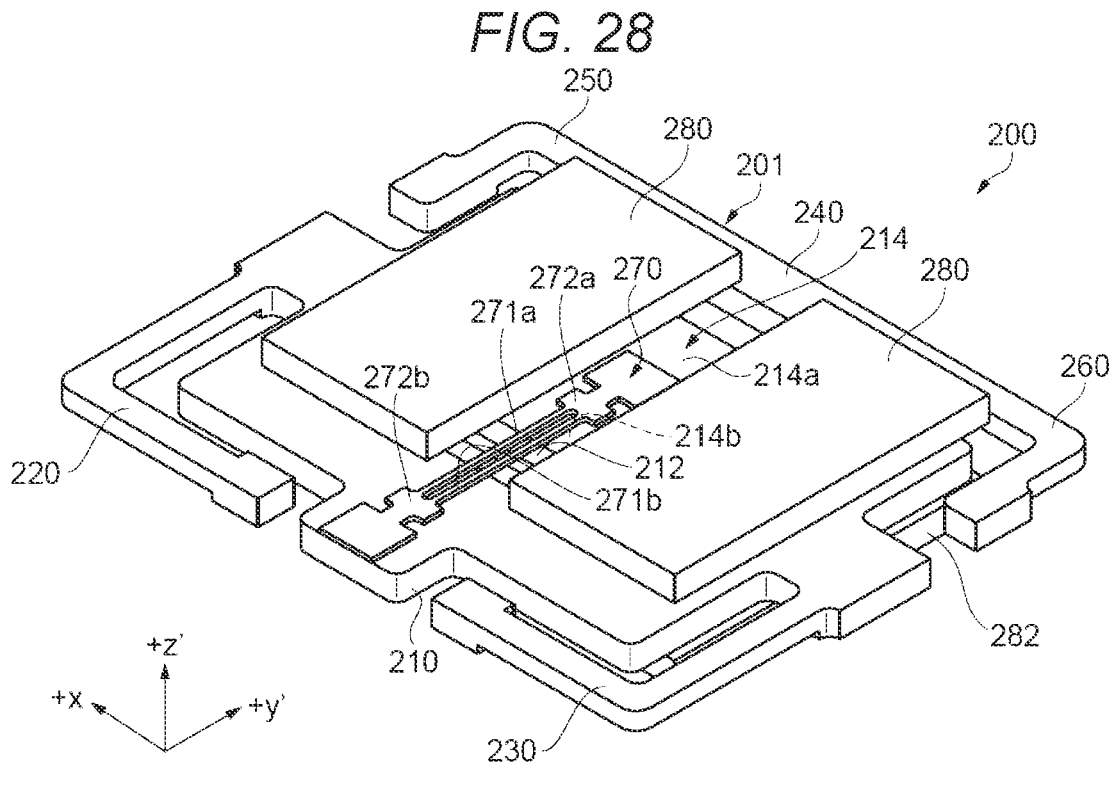
FIG. 28 is a perspective view showing a schematic configuration of a sensor element for detecting an acceleration.
FIG. 29 is a cross-sectional view showing a schematic configuration of an acceleration detector using the sensor element for detecting the acceleration.

FIG. 28 is a perspective view showing a schematic configuration of a sensor element for detecting an acceleration. FIG. 29 is a cross-sectional view showing a schematic configuration of an acceleration detector using the sensor element for detecting the acceleration.

In FIG. 28, the x-axis, a y'-axis, and a z'-axis are shown as three axes orthogonal to one another. In an orthogonal coordinate system including the x-axis as an electric axis, a y-axis as a mechanical axis, and a z-axis as an optical axis of a quartz crystal which is a piezoelectric material used as a base material of the acceleration sensor, an example will be described in which the quartz crystal is cut out along a plane defined by the x-axis and the y'-axis and is processed into a flat plate shape when the x-axis is a rotation axis, an axis which is inclined by a rotation angle (such that a +z side of the z-axis rotates in a −y direction of the y-axis is the z'-axis, and an axis which is inclined by the rotation angle φ such that a +y side of the y-axis rotates in a +z direction of the z-axis is the y'-axis, and a z' plate which is a so-called quartz crystal z plate having a predetermined thickness t in a z'-axis direction orthogonal to the plane is used as the base material. The rotation angle φ may be −5≤φ≤15°. In the acceleration sensors 118x, 118y, and 118z, the z′-axis is an axis along a direction in which gravity acts.

First, a configuration of a sensor element 200 that detects an acceleration will be described with reference to FIG. 28. The sensor element 200 includes a board structure 201 including a base portion 210 or the like, an acceleration detection element 270 that is coupled to the board structure 201 and detects a physical quantity, and mass portions 280 and 282.

The board structure 201 of the sensor element 200 includes the base portion 210, a movable portion 214 coupled to the base portion 210 via a joint portion 212, a coupling portion 240, and a first support portion 220, a second support portion 230, a third support portion 250, and a fourth support portion 260 which are coupled to the base portion 210. Here, the third support portion 250 and the fourth support portion 260 are coupled to each other on a side where the coupling portion 240 is disposed.

As the board structure 201, a quartz crystal board of the z′ plate, which is the quartz crystal z plate cut out at a predetermined angle as described above from a raw stone of a quartz crystal which is a piezoelectric material or the like, is used. By patterning the quartz crystal board, the quartz crystal board and the board structure 201 are integrally formed as the board structure 201. For the patterning, for example, a photolithography technique and a wet etching technique can be used.

The base portion 210 is coupled to the movable portion 214 via the joint portion 212, and supports the movable portion 214. The base portion 210 is coupled to the movable portion 214 via the joint portion 212, the coupling portion 240 located on an opposite side of the movable portion 214 from a side where the joint portion 212 is located, the first support portion 220, the second support portion 230, and the third support portion 250 and the fourth support portion 260 which are coupled to each other on the coupling portion 240 side.

The joint portion 212 is provided between the base portion 210 and the movable portion 214, and is coupled to the base portion 210 and the movable portion 214. A thickness of the joint portion 212 is smaller than a thickness of the base portion 210 and a thickness of the movable portion 214, and is formed in a constricted shape in a cross-sectional view from the x-axis direction. The joint portion 212 is formed as a thin portion having a small thickness by, for example, half-etching the board structure 201 including the joint portion 212. The joint portion 212 serves as a rotation axis along the x-axis direction as a fulcrum when the movable portion 214 is displaced with respect to the base portion 210.

The movable portion 214 is coupled to the base portion 210 via the joint portion 212. The movable portion 214 has a plate shape, and has main surfaces 214a and 214b facing each other along the z′-axis direction and having a front and back relationship. The movable portion 214 is displaced in a direction intersecting the main surfaces 214a and 214b, that is, in the z′-axis direction, with the joint portion 212 as a fulcrum, in response to an acceleration which is a physical quantity applied in a direction intersecting the main surfaces 214a and 214b, that is, in the z′-axis direction.

The coupling portion 240 extends from the base portion 210, which is on a +x direction side where the third support portion 250 to be described later is provided, in a manner of surrounding the movable portion 214 along the x-axis direction, and is coupled to the base portion 210 on a −x direction side where the fourth support portion 260 to be described later is provided.

The first support portion 220 and the second support portion 230 are provided symmetrically with respect to the acceleration detection element 270. The third support portion 250 and the fourth support portion 260 are provided symmetrically with respect to the acceleration detection element 270. In the first support portion 220, the second support portion 230, the third support portion 250, and the fourth support portion 260, the board structure 201 is supported by a fixed portion.

The acceleration detection element 270 is coupled to the base portion 210 and the movable portion 214. In other words, the acceleration detection element 270 straddles the base portion 210 and the movable portion 214. The acceleration detection element 270 includes vibration beam portions 271a and 271b as vibration portions, a first base portion 272a, and a second base portion 272b. In the acceleration detection element 270 in which the first base portion 272a and the second base portion 272b are coupled to the base portion 210, for example, when the movable portion 214 is displaced in response to the physical quantity, stress is generated in the vibration beam portions 271a and 271b, and physical quantity detection information generated in the vibration beam portions 271a and 271b is changed. In other words, vibration frequencies of the vibration beam portions 271a and 271b change. The acceleration detection element 270 in the embodiment is a double-tuning fork type vibration element including the two vibration beam portions 271a and 271b, the first base portion 272a, and the second base portion 272b. Here, the vibration beam portions 271a and 271b as the vibration portions may be referred to as vibration arms, vibration beams, columnar beams, or the like.

As the acceleration detection element 270, a quartz crystal board of the z′ plate, which is the quartz crystal z plate cut out at a predetermined angle from a raw stone of quartz crystal which is a piezoelectric material or the like, is used, similar to the board structure 201 described above. The acceleration detection element 270 is formed by patterning the quartz crystal board by a photolithography technique and an etching technique. Accordingly, the vibration beam portions 271a and 271b, the first base portion 272a, and the second base portion 272b can be integrally formed.

A material of the acceleration detection element 270 is not limited to the quartz crystal board described above. As the material of the acceleration detection element 270, for example, a piezoelectric material such as lithium tantalate (LiTaO₃), lithium tetraborate (Li₂B₄O₇), lithium niobate (LiNbO₃), lead zirconate titanate (PZT), zinc oxide (ZnO), or aluminum nitride (AlN), or a semiconductor material such as silicon provided with a piezoelectric film such as zinc oxide (ZnO) or aluminum nitride (AlN) can be used. In this case, the same material for the board structure 201 and the acceleration detection element 270 may be used.

Although illustration and description are omitted, the acceleration detection element 270 may be provided with an extraction electrode or an excitation electrode.

The mass portions 280 and 282 are provided on the main surface 214a of the movable portion 214 and the main surface 214b which is the back surface in the front and back relationship with the main surface 214a. Specifically, the mass portions 280 and 282 are provided on the main surface 214a and the main surface 214b via a mass bonding material (not shown). Examples of the material of the mass portions 280 and 282 include metals such as copper (Cu) and gold (Au).

In the embodiment, the acceleration detection element 270 is implemented by the double-tuning fork type vibration element whose vibration portion includes two columnar beams, that is, the vibration beam portions 271*a* and 271*b*, but the vibration portion may include one columnar beam.

Next, a configuration of an acceleration detector 300 using the above-described sensor element 200 that detects the acceleration will be described with reference to FIG. 29.

As shown in FIG. 29, the above-described sensor element 200 is mounted in the acceleration detector 300. The acceleration detector 300 includes the sensor element 200 and a package 310. The package 310 includes a package base 320 and a lid 330. The sensor element 200 is housed in the package 310 of the acceleration detector 300. Specifically, the sensor element 200 is housed in a space 311 provided by coupling the package base 320 and the lid 330 to each other.

The package base 320 has a recess portion 321, and the sensor element 200 is provided in the recess portion 321. A shape of the package base 320 is not particularly limited as long as the sensor element 200 can be housed in the recess portion 321. As the package base 320 in the embodiment, for example, a material such as ceramics, quartz crystal, glass, or silicon can be used.

The package base 320 includes a step portion 323 protruding toward the lid 330 from an inner bottom surface 322, which is a bottom surface inside the recess portion of the package base 320. The step portion 323 is provided, for example, along an inner wall of the recess portion 321. The step portion 323 includes a plurality of internal terminals 340*b*.

The internal terminals 340*b* face fixing portion coupling terminals 379*b* provided in fixing portions of the first support portion 220, the second support portion 230, the third support portion 250, and the fourth support portion 260 of the sensor element 200 in positions overlapping the fixing portion coupling terminals 379*b* in a plan view. The internal terminals 340*b* are electrically coupled to the fixing portion coupling terminals 379*b* using, for example, a silicone resin-based conductive adhesive 343 containing a conductive substance such as a metal filler. Accordingly, the sensor element 200 is mounted on the package base 320 and housed in the package 310.

In the package base 320, an outer bottom surface 324, which is an opposite surface to the inner bottom surface 322, is provided with external terminals 344 used when the package base 320 is mounted on an external member. The external terminals 344 are electrically coupled to the internal terminals 340*b* via internal interconnects (not shown).

The internal terminals 340*b* and the external terminals 344 are formed of, for example, a metal film in which a film of nickel (Ni), gold (Au), or the like is stacked on a metalized layer of tungsten (W) or the like by a method such as plating.

The package base 320 is provided with a sealing portion 350 that seals the inside of the package 310 on a bottom portion of the recess portion 321. The sealing portion 350 is provided in a through hole 325 formed in the package base 320. The through hole 325 penetrates from the outer bottom surface 324 to the inner bottom surface 322. In the example shown in FIG. 29, the through hole 325 has a stepped shape in which a hole diameter on an outer bottom surface 324 side is larger than a hole diameter on an inner bottom surface 322 side. The sealing portion 350 is formed by disposing a sealing material made of, for example, gold (Au), a germanium (Ge) alloy, and solder in the through hole 325, heating and melting the sealing material, and then solidifying the sealing material. The sealing portion 350 hermetically seals the inside of the package 310.

The lid 330 covers the recess portion 321 of the package base 320. A shape of the lid 330 is, for example, a plate shape. As the lid 330, for example, the same material as that of the package base 320, and a metal such as an alloy of iron (Fe) and nickel (Ni) or stainless steel can be used. The lid 330 is bonded to the package base 320 via a lid bonding member 332. As the lid bonding member 332, for example, a seam ring, low-melting glass, and an inorganic adhesive can be used.

After the lid 330 is bonded to the package base 320 in a state in which the inside of the package 310 is depressurized, that is, in a state in which the degree of vacuum is high, the inside of the package 310 can be hermetically sealed by providing the sealing portion 350 by disposing the sealing material in the through hole 325, heating and melting the sealing material, and solidifying the sealing material. The inside of the package 310 may be filled with an inert gas such as nitrogen, helium, or argon.

In the acceleration detector 300, when a drive signal is applied from the oscillation circuit mounted on the IC 181 to an excitation electrode of the sensor element 200 via the external terminals 344, the internal terminals 340*b*, the fixing portion coupling terminals 379*b*, or the like, the vibration beam portions 271*a* and 271*b* of the sensor element 200 vibrate at a predetermined frequency. The acceleration detector 300 outputs, as an output signal, a resonance frequency of the sensor element 200 that changes in response to the applied acceleration. The acceleration detector 300 can be used as the acceleration sensors 118*x*, 118*y*, and 118*z* shown in FIG. 27, and the acceleration sensors 118*x*, 118*y*, and 118*z* output the measurement target signals TRG1, TRG2, and TRG3 having frequencies corresponding to the applied accelerations.

In FIGS. 26 to 29, the sensor module 1 including the acceleration sensors 118*x*, 118*y*, and 118*z* as the first physical quantity sensor 10-1, the second physical quantity sensor 10-2, and the third physical quantity sensor 10-3 is described as an example, but the sensor module 1 may be a sensor module including a plurality of physical quantity sensors each of which detects at least one of a mass, an angular velocity, an angular acceleration, a pressure, a voltage, a magnetic force, a static capacitance, and a temperature as the physical quantity.

For a mass sensor that detects a mass as the physical quantity, a quartz crystal vibrator microbalance method is known as a method for measuring a minute mass change. Such a mass sensor utilizes a fact that an oscillation frequency of the quartz crystal vibrator decreases as the mass of a substance attached to an electrode surface of the quartz crystal vibrator increases, and the oscillation frequency increases as the mass of a substance attached to the electrode surface decreases. Detection sensitivity of the mass sensor as described above can be calculated by the Sauerbrey equation, and for example, in the case of an AT cut quartz crystal vibrator having a basic frequency of 27 MHz, a decrease in frequency of 1 Hz corresponds to an increase in mass of 0.62 ng/cm$^2$ on the electrode surface.

An angular velocity sensor that detects an angular velocity or an angular acceleration as the physical quantity detects an angular velocity by utilizing a fact that, when an object rotating at a constant angular velocity ω is observed from an observation point rotating at an angular velocity Q, the angular velocity of the object appears to be ω–Q. In such an angular velocity sensor, it is utilized that, when a sensor element receives an angular acceleration in a state where a wave having a natural frequency is circulated by electrostatically driving a disk-shaped mass using an electrode, an apparent resonance frequency observed from the electrode changes. In the angular velocity sensor as described above, there is no limitation on a bandwidth in principle, and for example, high accuracy of a technique related to frequency measurement and a technique related to nonlinearity correction directly leads to high sensitivity of the detection sensitivity.

In a capacitance sensor that detects a static capacitance as the physical quantity, a measurement target capacitance can be measured by performing RC oscillation using a reference resistance and the measurement target capacitance and measuring an oscillation frequency. When the measurement target capacitance changes, a time constant given by the RC changes and the oscillation frequency shifts. In the capacitance sensor, various error factors can be eliminated by preparing a reference capacitance separately from the measurement target capacitance, performing RC oscillation using the reference resistance and the reference capacitance, using the RC oscillation as a reference oscillation frequency, and using a mechanism for detecting a difference between the reference oscillation frequency and the previous oscillation frequency.

In a temperature sensor that detects a temperature as the physical quantity, a temperature can be measured by performing RC oscillation using a thermistor and a reference capacitance, and measuring an oscillation frequency. When a resistance value of the thermistor changes depending on the temperature, the time constant given by the RC changes and the oscillation frequency shifts. In the temperature sensor, various error factors can be eliminated by preparing a reference resistance separately from the thermistor, performing RC oscillation using the reference resistance and the reference capacitance, using the RC oscillation as a reference oscillation frequency, and detecting a difference between the reference oscillation frequency and the previous oscillation frequency.

As described above, the sensor module 1 according to the fifth embodiment generates the first to n-th count values $DCNT_1$ to $DCNT_n$ and the first to n-th time digital values $TD_1$ to $TD_n$ which are digital values without performing analog signal processing on the m-th measurement target signal TRGm output from the m-th physical quantity sensor 10-m, and generates the first to n-th combined output values $DTS_1$ to $DTS_n$ based on the first to n-th count values $DCNT_1$ to $DCNT_n$ and the first to n-th time digital values $TD_1$ to $TD_n$. Accordingly, according to the sensor module 1 of the fifth embodiment, even when the m-th measurement target signal TRGm includes a frequency components generated due to high-frequency electromagnetic vibration noise generated in a measurement target object to which the m-th physical quantity sensor 10-m is attached and a higher harmonic components of the frequency components, the sensor module 1 is hardly affected by the high-frequency electromagnetic vibration noise since an analog circuit which is easily affected by high-frequency noise is not necessary. According to the sensor module 1 of the fifth embodiment, it is not necessary to remove the frequency components generated due to the high-frequency electromagnetic vibration noise and the higher harmonic components of the frequency components from the m-th measurement target signal TRGm, and thus a circuit scale is reduced.

In the sensor module 1 according to the fifth embodiment, in the m-th combined output value generation unit 50-m, the quantization error of the j-th combined output value $DTS_j$ is fed back to the generation of the (j+1)-th combined output value $DTS_{j+1}$, and thus the first to n-th combined output values $DTS_1$ to $DTS_n$ satisfy the property of the delta-sigma modulation signal, the noise shaping effect is obtained, and the quantization error is shifted to the high-frequency band. According to the sensor module 1 of the fifth embodiment, an S/N ratio of a physical quantity component calculated based on the first to n-th combined output values $DTS_1$ to $DTS_n$ generated by the m-th combined output value generation unit 50-m is improved, and the measurement accuracy of the m-th physical quantity obtained by the external device is improved.

In general, since there is a difference in measurement accuracy between the direct counting method and the reciprocal counting method, it is necessary to select an optimum counting method according to a relationship between the frequency band of the measurement target signal and the frequency of the reference periodic signal. However, according to the sensor module 1 of the fifth embodiment, in the m-th combined output value generation unit 50-m, the first to n-th combined output values $DTS_1$ to $DTS_n$ satisfy the property of the delta-sigma modulation signal, and thus the same measurement accuracy can be obtained in both methods. Therefore, the counting method can be selected without considering the restriction of the measurement accuracy. For example, in the m-th count unit 30-m, as compared with a configuration in which a time event of a signal in the m-th measurement target signal TRGm and the reference periodic signal CLK which has a longer period is counted in synchronization with a signal having a shorter period, by adopting a configuration in which a time event of the signal having the shorter period is counted in synchronization with the signal having the longer period, it is possible to lower the operation frequency, and thus it is possible to reduce the power consumption while maintaining the measurement accuracy.

According to the sensor module 1 of the fifth embodiment, since the period $T_{min}$ of the change in the m-th physical quantity when the frequency, at which the m-th physical quantity applied to the m-th physical quantity sensor 10-m changes, is the maximum frequency $f_{max}$ in the frequency band F of the m-th physical quantity, is longer than eight times the average period $T_{avg}$ in which the first to n-th combined output values $DTS_1$ to $DTS_n$ are generated by the m-th combined output value generation unit 50-m, various bad influences due to spuriousness, aliasing, or the like can be reduced to an allowable level or less in a realistic time.

According to the sensor module 1 of the fifth embodiment, an upper limit of a frequency band in which the m-th physical quantity can be measured in real time is limited by a communication rate with the external device. However, even when the frequency of the m-th measurement target signal TRGm is higher than the communication rate, the external device can offline obtain the p combined output values stored in the m-th storage unit 70-m and measure a signal component in a frequency band higher than the frequency band in which the m-th physical quantity can be measured in real time.

According to the sensor module 1 of the fifth embodiment, the external device may offline obtain the p combined output values stored in the m-th storage unit 70-m, and thus can communicate with the external device using a general protocol such as SPI, I2C, or UART. Accordingly, for example, in an inspection process of the sensor module 1, it is not necessary to incorporate dedicated software for reading combined output values into an inspection device, and an inspection system can be easily constructed.

According to the sensor module 1 of the fifth embodiment, the combined output values generated by the first to N-th combined output value generation units 50-1 to 50-N are not commonly stored in the same storage unit, but are stored in the first to N-th storage units 70-1 to 70-N, and thus a timing design of the first to N-th storage units 70-1 to 70-N is facilitated.

According to the sensor module 1 of the fifth embodiment, the m-th storage unit 70-*m* simultaneously stores the p continuous combined output values and the count values corresponding to all of the p continuous combined output values. Therefore, the external device can obtain the p combined output values and the count values stored in the m-th storage unit 70-*m*, and can grasp, based on the count values, the timing at which the p combined output values are generated. Accordingly, the external device can synchronously measure the first to N-th physical quantities which are unsynchronously detected by the first to N-th physical quantity sensors 10-1 to 10-N. In particular, since each of the first to N-th storage units 70-1 to 70-N stores the p combined output values and a count value corresponding to the latest combined output value among the p combined output values, the external device can easily measure the first to N-th physical quantities in synchronization.

According to the sensor module 1 of the fifth embodiment, the same effects as those of the sensor module 1 of the first embodiment to the fourth embodiment can be obtained.

6. Modification

In the above embodiments, the combined output value generation unit 50 generates the first to n-th combined output values $DTS_1$ to $DTS_n$ in synchronization with both the rising edge and the falling edge of the measurement target signal TRG. In this case, a difference between the (j+1)-th combined output value $DTS_{j+1}$ and the j-th combined output value $DTS_j$ corresponds to a time of a half cycle of the measurement target signal TRG. On the other hand, the combined output value generation unit 50 may generate the first to n-th combined output values $DTS_1$ to $DTS_n$ in synchronization with only one of the rising edge and the falling edge of the measurement target signal TRG. In this case, the difference between the (j+1)-th combined output value $DTS_{j+1}$ and the j-th combined output value $DTS_j$ corresponds to a time of one cycle of the measurement target signal TRG.

The sensor module 1 according to the first embodiment, the second embodiment, or the third embodiment may not include the filter unit 60. The sensor module 1 according to the fourth embodiment or the fifth embodiment may include the filter unit 60 at a stage subsequent to the combined output value generation unit 50 and a stage before or subsequent to the storage unit 70.

The sensor module 1 according to the first embodiment, the second embodiment, or the third embodiment may be combined with the sensor module 1 according to the fourth embodiment or the fifth embodiment. That is, the sensor module 1 may have a mode of generating and outputting combined output values in real time as in the first embodiment, the second embodiment, or the third embodiment, and a mode of offline outputting temporarily stored combined output values as in the fourth embodiment or the fifth embodiment.

In each of the embodiments described above, the frequency of the measurement target signal TRG is lower than the frequency of the reference periodic signal CLK, and thus the reciprocal counting method is adopted. However, the present disclosure is not limited to the reciprocal counting method, and the same effects can be obtained by inputting and operating the measurement target signal as CLK in FIG. 1 and the reference periodic signal as TRG in FIG. 1. Therefore, the present disclosure may adopt the "direct counting method", but not the "reciprocal counting method", regardless of the magnitude of the frequency.

Although the embodiments and modifications are described above, the present disclosure is not limited to these embodiments, and can be implemented in various aspects without departing from the scope of the disclosure. For example, the above embodiments may be combined appropriately.

The present disclosure includes a configuration substantially the same as the configurations described in the embodiments, for example, a configuration having the same function, method, and result, or a configuration having the same purpose and effect. The present disclosure includes a configuration obtained by replacing a non-essential portion of the configurations described in the embodiments. The present disclosure includes a configuration having the same function and effect as the configurations described in the embodiments, or a configuration capable of achieving the same purpose. The present disclosure includes a configuration in which a known technique is added to the configurations described in the embodiments.

The following contents are derived from the above embodiments and modifications.

An aspect of the disclosure is a sensor module including: a physical quantity sensor configured to output a measurement target signal whose frequency changes according to a magnitude of a detected physical quantity; a reference periodic signal generation unit configured to output a reference periodic signal; a count unit configured to count a time event of one of the measurement target signal and the reference periodic signal in synchronization with the other to generate first to n-th count values in time series, n being an integer of 2 or more; a time digital value generation unit configured to generate first to n-th time digital values, based on a phase difference between the measurement target signal and the reference periodic signal, in time series; and a combined output value generation unit configured to generate an i-th combined output value based on the i-th time digital value and the i-th count value, i being an integer of 1 or more and n or less, in which a quantization error of the j-th combined output value is fed back to generation of the (j+1)-th combined output value, j being an integer of 1 or more and n−1 or less, and a period of a change in the physical quantity when a frequency, at which the physical quantity changes, is a maximum frequency in a frequency band which is defined by a specification and in which the physical quantity is detectable, is longer than eight times an average period in which the first to n-th combined output values are generated.

The sensor module generates the first to n-th count values and the first to n-th time digital values which are digital values without performing analog signal processing on the measurement target signal output from the physical quantity sensor, and generates the first to n-th combined output values based on the first to n-th count values and the first to n-th time digital values. Accordingly, according to the sensor module, even when the measurement target signal includes a frequency components generated due to high-frequency electromagnetic vibration noise generated in the measurement target object to which the physical quantity sensor is attached and a higher harmonic components of the frequency components, the sensor module is hardly affected by the high-frequency electromagnetic vibration noise since an analog circuit which is easily affected by high-frequency noise is not necessary. According to the sensor module, it is not necessary to remove the frequency components generated due to the high-frequency electromagnetic vibration noise and the higher harmonic components of the frequency components from the measurement target signal, and thus a circuit scale is reduced.

In the sensor module, the quantization error of the j-th combined output value is fed back to the generation of the (j+1)-th combined output value, and thus the first to n-th combined output values satisfy a property of a delta-sigma modulation signal, a noise shaping effect is obtained, and the quantization error is shifted to a high-frequency band. Accordingly, according to the sensor module, an S/N ratio of a physical quantity component calculated based on the first to n-th combined output values is increased.

In general, since there is a difference in measurement accuracy between a direct counting method and a reciprocal counting method, it is necessary to select an optimum counting method according to a relationship between a frequency band of the measurement target signal and a frequency of the reference periodic signal. However, according to the sensor module, the first to n-th combined output values satisfy the property of the delta-sigma modulation signal, and thus the same measurement accuracy can be obtained in both methods. Therefore, the counting method can be selected without considering the restriction of the measurement accuracy. For example, in the count unit, as compared with a configuration in which a time event of a signal in the measurement target signal and the reference periodic signal which has a longer period is counted in synchronization with a signal having a shorter period, by adopting a configuration in which a time event of the signal having the shorter period is counted in synchronization with the signal having the longer period, it is possible to lower an operation frequency, and thus it is possible to reduce the power consumption while maintaining the measurement accuracy.

According to the sensor module, since the period of the change in the physical quantity when the frequency, at which the physical quantity changes, is the maximum frequency in the frequency band of the physical quantity, is longer than eight times the average period in which the first to n-th combined output values are generated, various bad influences due to spuriousness, aliasing, or the like can be reduced to an allowable level or less in a realistic time.

In the sensor module of the above aspect, the time digital value generation unit may generate the first to n-th time digital values by a multiphase clock method, a time and voltage conversion method, or a EATDC method.

In the sensor module of the above aspect, the combined output value generation unit may generate the first to n-th combined output values in time series at both a rising timing and a falling timing of the measurement target signal.

Accordingly, according to the sensor module, since two combined output values per cycle of the measurement target signal are generated, the first to n-th combined output values can be generated at a rate twice the frequency of the measurement target signal.

According to the sensor module, since n/2 combined output values corresponding to a time at a high level of the measurement target signal and n/2 combined output values corresponding to a time at a low level of the measurement target signal are obtained, the external device can calculate a duty ratio of the measurement target signal based on the first to n-th combined output values. Accordingly, for example, by adjusting an oscillation circuit provided in the physical quantity sensor such that the duty ratio of the measurement target signal is 50:50, the external device can reduce a noise component included in the measurement target signal by reducing distortion of the measurement target signal.

The sensor module of the above aspect may further include a filter unit in a stage subsequent to the combined output value generation unit.

According to the sensor module, in the filter unit, various types of signal processing can be performed on the first to n-th combined output values.

In the sensor module of the above aspect, the filter unit may perform decimation processing on the first to n-th combined output values.

According to the sensor module, since a sample rate can be reduced in the filter unit, power consumption of a circuit in a stage subsequent to the filter unit can be reduced. According to the sensor module, for example, when a signal component of a measurement target included in the measurement target signal is present in a low-frequency band, an amount of data can be effectively reduced by increasing a decimation ratio.

In the sensor module of the above aspect, the combined output value generation unit may generate the first to n-th combined output values in time series at both a rising timing and a falling timing of the measurement target signal, and the filter unit may perform moving average processing of even number taps on the first to n-th combined output values.

According to the sensor module, since the combined output values corresponding to the time at the high level of the measurement target signal and the combined output values corresponding to the time at the low level of the measurement target signal are averaged, the noise component generated due to the duty ratio included in the measurement target signal can be reduced.

In the sensor module of the above aspect, the combined output value generation unit may generate the i-th combined output value by subtracting an offset value from a value obtained by combining the i-th time digital value and the i-th count value.

According to the sensor module, since an absolute value of the first to n-th combined output values is reduced, the number of bits of the first to n-th combined output values can be reduced. Accordingly, for example, when a part or all of the first to n-th combined output values are stored in the storage unit and output to the outside at an appropriate timing, a size or a communication amount of the storage unit can be reduced.

The sensor module of the above aspect may further include: a storage unit configured to store p continuous combined output values among the first to n-th combined output values, and the stored p combined output values may be output from the storage unit based on a control signal.

According to the sensor module, an upper limit of a frequency band in which the physical quantity can be measured in real time is limited by a communication rate with the external device. However, even when the frequency of the measurement target signal is higher than the communication rate, the external device can offline obtain the p combined output values stored in the storage unit and measure a signal component in a frequency band higher than the frequency band in which the physical quantity can be measured in real time.

According to the sensor module, the external device may offline obtain the p combined output values stored in the storage unit, and thus can communicate with the external device using a general protocol such as SPI, I2C, or UART. Accordingly, for example, in an inspection process of the sensor module, it is not necessary to incorporate dedicated software for reading combined output values into an inspection device, and an inspection system can be easily constructed.

In the sensor module of the above aspect, each of the first to n-th combined output values may be a value based on a time stamp difference, and the storage unit may further store one of the (k+1)-th to (k+p)-th count values when the (k+1)-th to (k+p)-th combined output values are stored as the p combined output values.

According to the sensor module, since each of the first to n-th combined output values is a value based on the time stamp difference, the absolute value of each of the first to n-th combined output values is smaller than that when each of the first to n-th combined output values is a time stamp, and thus the number of bits of the first to n-th combined output values can be reduced. Accordingly, it is possible to reduce the size of the storage unit that stores the p continuous combined output values among the first to n-th combined output values and the amount of communication with the external device.

According to the sensor module, the storage unit simultaneously stores the p continuous combined output values and the count values corresponding to all of the p continuous combined output values. Therefore, the external device can obtain the p combined output values and the count values stored in the storage unit, and can grasp, based on the count values, a timing at which the p combined output values are generated. Accordingly, for example, when the sensor module includes a plurality of physical quantity sensors, or in a system including a plurality of sensor modules including the sensor module, the external device can synchronously measure a plurality of physical quantities which are non-synchronously detected by the plurality of physical quantity sensors.

In the sensor module of the above aspect, when the storage unit is a ring buffer and stores the (k+1)-th to (k+p)-th combined output values as the p combined output values, storing of the (k+p+1)-th combined output value and the subsequent combined output values may be stopped and the (k+1)-th to (k+p)-th combined output values may be output based on the control signal.

According to the sensor module, the storage unit is a ring buffer, and can more easily store the latest p combined output values using a capacity of the storage unit as the maximum limit by overwriting the oldest combined output value each time a combined output value is generated.

According to the sensor module, since the storage unit stops storing the combined output value based on the control signal, the external device can quickly obtain the p combined output values from the storage unit at a predetermined timing based on the control signal.

In the sensor module of the above aspect, each of the first to n-th combined output values may be a value based on a time stamp difference, and the storage unit may further store the (k+p)-th count value when the (k+1)-th to (k+p)-th combined output values are stored as the p combined output values, and the (k+1)-th to (k+p)-th combined output values and the (k+p)-th count value may be output based on the control signal.

According to the sensor module, since each of the first to n-th combined output values is a value based on the time stamp difference, the absolute value of each of the first to n-th combined output values is smaller than that when each of the first to n-th combined output values is a time stamp, and thus the number of bits of the first to n-th combined output values can be reduced. Accordingly, it is possible to reduce the size of the storage unit that stores the p continuous combined output values among the first to n-th combined output values and the amount of communication with the external device.

According to the sensor module, the storage unit simultaneously stores the p continuous combined output values and a count value corresponding to the latest combined output value among the p continuous combined output values. Therefore, the external device can obtain the p combined output values and the count value stored in the storage unit, and can grasp, based on the count value, a timing at which the p combined output values are generated. Accordingly, for example, when the sensor module includes a plurality of physical quantity sensors, or in a system including a plurality of sensor modules including the sensor module, the external device can synchronously measure a plurality of physical quantities which are non-synchronously detected by the plurality of physical quantity sensors.

Another aspect of the disclosure is a sensor module including: first to N-th physical quantity sensors; first to N-th count units; first to N-th time digital value generation units; first to N-th combined output value generation units; first to N-th storage units; and a reference periodic signal generation unit configured to output a reference periodic signal, N being an integer of 2 or more, the m-th physical quantity sensor is configured to output an m-th measurement target signal whose frequency changes according to a magnitude of a detected m-th physical quantity, the m-th count unit is configured to count a time event of one of the m-th measurement target signal and the reference periodic signal in synchronization with the other to generate first to n-th count values in time series, n being an integer of 2 or more, the m-th time digital value generation unit is configured to generate first to n-th time digital values, each of which is based on a phase difference between the m-th measurement target signal and the reference periodic signal, in time series, the m-th combined output value generation unit is configured to generate an i-th combined output value based on the i-th time digital value generated by the m-th time digital value generation unit and the i-th count value generated by the m-th count unit, i being an integer of 1 or more and n or less, the m-th storage unit is configured to store p continuous combined output values among the first to n-th combined output values generated by the m-th combined output value generation unit, and the stored p combined output values are output based on a control signal, a quantization error of the j-th combined output value generated by the m-th combined output value generation unit is fed back to generation of the (j+1)-th combined output value, j being an integer of 1 or more and n−1 or less, and a period of a change of the m-th physical quantity when a frequency, at which the m-th physical quantity changes, is a maximum frequency in a frequency band which is defined by a specification and in which the m-th physical quantity is detectable, is longer than eight times an average period in which the first to n-th combined output values are generated by the m-th combined output value generation unit, m being an integer of 1 or more and N or less.

The sensor module generates the first to n-th count values and the first to n-th time digital values which are digital values without performing analog signal processing on the m-th measurement target signal output from the m-th physical quantity sensor, and generates the first to n-th combined output values based on the first to n-th count values and the first to n-th time digital values. Accordingly, according to the sensor module, even when the m-th measurement target signal includes a frequency components generated due to high-frequency electromagnetic vibration noise generated in a measurement target object to which the m-th physical quantity sensor is attached and a higher harmonic components of the frequency components, the sensor module is hardly affected by the high-frequency electromagnetic vibration noise since an analog circuit which is easily affected by high-frequency noise is not necessary. According to the sensor module, it is not necessary to remove the frequency components generated due to the high-frequency electromagnetic vibration noise and the higher harmonic components of the frequency components from the m-th measurement target signal, and thus a circuit scale is reduced.

In the sensor module, in the m-th combined output value generation unit, the quantization error of the j-th combined output value is fed back to the generation of the (j+1)-th combined output value, and thus the first to n-th combined output values satisfy a property of a delta-sigma modulation signal, a noise shaping effect is obtained, and the quantization error is shifted to a high-frequency band. Accordingly, according to the sensor module, an S/N ratio of an m-th physical quantity component calculated based on the first to n-th combined output values generated by the m-th combined output value generation unit is increased.

In general, since there is a difference in measurement accuracy between a direct counting method and a reciprocal counting method, it is necessary to select an optimum counting method according to a relationship between a frequency band of the m-th measurement target signal and a frequency of the reference periodic signal. However, according to the sensor module, in the m-th combined output value generation unit, the first to n-th combined output values satisfy the property of the delta-sigma modulation signal, and thus the same measurement accuracy can be obtained in any method. Therefore, the counting method can be selected without considering the restriction of the measurement accuracy. For example, in the m-th count unit, as compared with a configuration in which a time event of a signal in the m-th measurement target signal and the reference periodic signal which has a longer period is counted in synchronization with a signal having a shorter period, by adopting a configuration in which a time event of the signal having the shorter period is counted in synchronization with the signal having the longer period, it is possible to lower an operation frequency, and thus it is possible to reduce the power consumption while maintaining the measurement accuracy.

According to the sensor module, since the period of the change in the m-th physical quantity when the frequency at which the m-th physical quantity changes is the maximum frequency in the frequency band of the m-th physical quantity, is longer than eight times the average period in which the first to n-th combined output values are generated by the m-th combined output value generation unit, various bad influences due to spuriousness, aliasing, or the like can be reduced to an allowable level or less in a realistic time.

According to the sensor module, an upper limit of a frequency band in which the m-th physical quantity can be measured in real time is limited by a communication rate with the external device. However, even when the frequency of the m-th measurement target signal is higher than the communication rate, the external device can offline obtain the p combined output values stored in the m-th storage unit and measure a signal component in a frequency band higher than the frequency band in which the m-th physical quantity can be measured in real time.

According to the sensor module, the external device may offline obtain the p combined output values stored in the m-th storage unit, and thus can communicate with the external device using a general protocol such as SPI, I2C, or UART. Accordingly, for example, in an inspection process of the sensor module, it is not necessary to incorporate dedicated software for reading combined output values into an inspection device, and an inspection system can be easily constructed.

According to the sensor module, the combined output values generated by the first to N-th combined output value generation units are not commonly stored in the same storage unit, but are stored in the first to N-th storage units, and thus a timing design of the first to N-th storage units is facilitated.

What is claimed is:

1. A sensor module comprising:
   a physical quantity sensor configured to output a measurement target signal whose frequency changes according to a magnitude of a detected physical quantity;
   a reference periodic signal generation unit configured to output a reference periodic signal;
   a count unit configured to count a time event of one of the measurement target signal and the reference periodic signal in synchronization with the other of the measurement target signal and the reference periodic signal to generate first to n-th count values in time series, n being an integer of 2 or more;
   a time digital value generation unit configured to generate first to n-th time digital values, each of which is based on a phase difference between the measurement target signal and the reference periodic signal, in time series; and
   a combined output value generation unit configured to generate an i-th combined output value based on the i-th time digital value and the i-th count value, i being an integer between 1 to n, wherein
   the combined output value satisfies a property of a delta-sigma modulation signal to obtain a noise shaping effect,
   a quantization error of the j-th combined output value is fed back to generation of a (j+1)-th combined output value, j being an integer between 1 to n−1, and
   a period of a change in the physical quantity, when a frequency at which the detectable physical quantity changes is a maximum frequency in a frequency band, is longer than eight times an average period in which the first to n-th combined output values are generated.

2. The sensor module according to claim 1, wherein
   the time digital value generation unit is configured to generate the first to n-th time digital values by a multiphase clock method, a time and voltage conversion method, or a summation accumulated time to digital convert (ΣATDC) method.

3. The sensor module according to claim 1, wherein
   the combined output value generation unit is configured to generate the first to n-th combined output values in time series at both a rising timing and a falling timing of the measurement target signal.

4. The sensor module according to claim 1, further comprising:
   a filter unit in a stage subsequent to the combined output value generation unit.

5. The sensor module according to claim 4, wherein
the filter unit is configured to perform decimation processing on the first to n-th combined output values.

6. The sensor module according to claim 4, wherein
the combined output value generation unit is configured to generate the first to n-th combined output values in time series at both a rising timing and a falling timing of the measurement target signal, and
the filter unit is configured to perform moving average processing of even number taps on the first to n-th combined output values.

7. The sensor module according to claim 1, wherein
the combined output value generation unit is configured to generate the i-th combined output value by subtracting an offset value from a value obtained by combining the i-th time digital value and the i-th count value.

8. The sensor module according to claim 1, further comprising:
a storage unit configured to store p continuous combined output values among the first to n-th combined output values, wherein
the stored p combined output values are output from the storage unit based on a control signal.

9. The sensor module according to claim 8, wherein
each of the first to n-th combined output values is a value based on a time stamp difference, and
the storage unit is configured to further store one of the (k+1)-th to (k+p)-th count values when the (k+1)-th to (k+p)-th combined output values are stored as the p combined output values.

10. The sensor module according to claim 8, wherein
when the storage unit is a ring buffer and stores the (k+1)-th to (k+p)-th combined output values as the p combined output values, storing of the (k+p+1)-th combined output value and the subsequent combined output values is stopped and the (k+1)-th to (k+p)-th combined output values are output based on the control signal.

11. The sensor module according to claim 10, wherein
each of the first to n-th combined output values is a value based on a time stamp difference, and
the storage unit is configured to further store the (k+p)-th count value when the (k+1)-th to (k+p)-th combined output values are stored as the p combined output values, and the (k+1)-th to (k+p)-th combined output values and the (k+p)-th count value are output based on the control signal.

12. A sensor module comprising:
one or more physical quantity sensors;
one or more count units;
one or more time digital value generation units;
one or more combined output value generation units;
one or more storage units; and
a reference periodic signal generation unit configured to output a reference periodic signal, wherein
the m-th physical quantity sensor is configured to output an m-th measurement target signal whose frequency changes according to a magnitude of a detected m-th physical quantity,
the m-th count unit is configured to count a time event of one of the m-th measurement target signal and the reference periodic signal in synchronization with the other of the m-th measurement target signal and the reference periodic signal to generate first to n-th count values in time series, n being an integer of 2 or more,
the m-th time digital value generation unit is configured to generate first to n-th time digital values, each of which is based on a phase difference between the m-th measurement target signal and the reference periodic signal, in time series,
the m-th combined output value generation unit is configured to generate an i-th combined output value based on the i-th time digital value generated by the m-th time digital value generation unit and the i-th count value generated by the m-th count unit, i being an integer wherein $1 \leq i \leq n$, wherein the combined output value satisfies a property of a delta-sigma modulation signal to obtain a noise shaping effect,
the m-th storage unit is configured to store p continuous combined output values among the first to n-th combined output values generated by the m-th combined output value generation unit, and the stored p combined output values are output based on a control signal,
a quantization error of the j-th combined output value generated by the m-th combined output value generation unit is fed back to generation of the (j+1)-th combined output value, j being an integer wherein $1 \leq j \leq n-1$, and
a period of a change of the m-th physical quantity, when a frequency at which the detectable m-th physical quantity changes is a maximum frequency in a frequency band, is longer than eight times an average period in which the first to n-th combined output values are generated by the m-th combined output value generation unit, m being an integer of 1 or more.

* * * * *